United States Patent
Mann et al.

(10) Patent No.: US 10,481,500 B2
(45) Date of Patent: Nov. 19, 2019

(54) IMAGING OPTICAL SYSTEM AND PROJECTION EXPOSURE INSTALLATION FOR MICROLITHOGRAPHY WITH AN IMAGING OPTICAL SYSTEM OF THIS TYPE

(75) Inventors: Hans-Juergen Mann, Oberkochen (DE); Wilhelm Ulrich, Aalen (DE); Erik Loopstra, Eindhoven (NL); David R. Shafer, Fairfield, CT (US)

(73) Assignee: Carl Zeiss SMT GmbH, Oberkochen (DE)

( * ) Notice: Subject to any disclaimer, the term of this patent is extended or adjusted under 35 U.S.C. 154(b) by 2222 days.

(21) Appl. No.: 13/197,065

(22) Filed: Aug. 3, 2011

(65) Prior Publication Data

US 2012/0069312 A1  Mar. 22, 2012

Related U.S. Application Data

(63) Continuation of application No. PCT/EP2010/000602, filed on Feb. 2, 2010.
(Continued)

(30) Foreign Application Priority Data

Feb. 12, 2009 (DE) .................. 10 2009 008 644

(51) Int. Cl.
G03B 27/42 (2006.01)
G03F 7/20 (2006.01)
G02B 17/06 (2006.01)

(52) U.S. Cl.
CPC ..... *G03F 7/70233* (2013.01); *G02B 17/0647* (2013.01); *G02B 17/0663* (2013.01);
(Continued)

(58) Field of Classification Search
CPC .. G03F 7/70233; G03F 7/702; G03F 7/70225; G03F 7/706; G03F 7/70033; G03F 7/70116; G03F 7/20
(Continued)

(56) References Cited

U.S. PATENT DOCUMENTS 4,653,880 A  3/1987  Sting et al.
5,815,310 A  9/1998  Williamson
(Continued)

FOREIGN PATENT DOCUMENTS

CN  101088039  12/2007
CN  101221279 A  7/2008
(Continued)

OTHER PUBLICATIONS

Japanese Office Action, with English translation, issued in Japanese Application No. JP 2011-549476, dated Dec. 26, 2012.
(Continued)

*Primary Examiner* — Mesfin T Asfaw
(74) *Attorney, Agent, or Firm* — Fish & Richardson P.C.

(57) ABSTRACT

An imaging optical system has a plurality of mirrors which image an object field in an object plane in an image field in an image plane. The imaging optical system has a pupil obscuration. The last mirror in the beam path of the imaging light between the object field and the image field has a through-opening for the passage of the imaging light. A penultimate mirror of the imaging optical system in the beam path of the imaging light between the object field and the image field has no through-opening for the passage of the imaging light. The result is an imaging optical system that provides a combination of small imaging errors, manageable production and a good throughput for the imaging light.

14 Claims, 21 Drawing Sheets

Related U.S. Application Data

(60) Provisional application No. 61/151,871, filed on Feb. 12, 2009, provisional application No. 61/264,472, filed on Nov. 25, 2009.

(52) U.S. Cl.
CPC .......... *G03F 7/7015* (2013.01); *G03F 7/7025* (2013.01); *G02B 17/0652* (2013.01)

(58) Field of Classification Search
USPC ........................................ 355/53, 63, 67, 77
See application file for complete search history.

(56) References Cited

U.S. PATENT DOCUMENTS

| | | | |
|---|---|---|---|
| 6,033,079 | A | 3/2000 | Hudyma |
| 6,072,852 | A | 6/2000 | Hudyma |
| 6,318,869 | B1 | 11/2001 | Hudyma |
| 6,710,917 | B2 | 3/2004 | Mann et al. |
| 6,750,948 | B2 | 6/2004 | Omura |
| 6,975,385 | B2 | 12/2005 | Ohsaki et al. |
| 7,226,177 | B2 | 6/2007 | Sasaki et al. |
| 7,682,031 | B2 | 3/2010 | Mann et al. |
| 8,004,755 | B2 | 8/2011 | Mann et al. |
| 8,317,345 | B2 | 11/2012 | Mann et al. |
| 8,520,291 | B2 | 8/2013 | Tanaka |
| 8,610,877 | B2 | 12/2013 | Mann et al. |
| 8,632,195 | B2 | 1/2014 | Mann et al. |
| 9,500,958 | B2 | 11/2016 | Mann et al. |
| 2002/0154395 | A1 | 10/2002 | Mann et al. |
| 2002/0176063 | A1* | 11/2002 | Omura ........................... 355/67 |
| 2003/0147131 | A1 | 8/2003 | Terasawa |
| 2003/0169411 | A1 | 9/2003 | Ota |
| 2004/0165255 | A1 | 8/2004 | Sasaki et al. |
| 2004/0223130 | A1 | 11/2004 | Hatakeyama et al. |
| 2006/0232867 | A1 | 10/2006 | Mann et al. |
| 2007/0058269 | A1 | 3/2007 | Mann et al. |
| 2008/0118849 | A1 | 5/2008 | Chandhock et al. |
| 2008/0137183 | A1 | 6/2008 | Mann et al. |
| 2008/0165415 | A1 | 7/2008 | Chan et al. |
| 2008/0170216 | A1 | 7/2008 | Mann |
| 2008/0170310 | A1 | 7/2008 | Mann et al. |
| 2008/0316451 | A1 | 12/2008 | Mann et al. |
| 2010/0134908 | A1 | 6/2010 | Mann et al. |
| 2011/0273791 | A1 | 11/2011 | Mann et al. |
| 2012/0008124 | A1 | 1/2012 | Mann et al. |
| 2012/0069312 | A1 | 3/2012 | Mann et al. |
| 2012/0236282 | A1 | 9/2012 | Mann |
| 2013/0063710 | A1 | 3/2013 | Mann et al. |
| 2013/0342821 | A1 | 12/2013 | Mann |
| 2014/0098355 | A1 | 4/2014 | Mann et al. |

FOREIGN PATENT DOCUMENTS

| | | |
|---|---|---|
| CN | 101226272 A | 7/2008 |
| CN | 101263430 A | 9/2008 |
| EP | 0 779 528 A2 | 6/1997 |
| EP | 1093021 | 4/2001 |
| EP | 1 450 209 | 8/2004 |
| EP | 1950594 | 7/2008 |
| JP | 9-211332 | 8/1997 |
| JP | 2001-185480 | 7/2001 |
| JP | 2002-139672 | 5/2002 |
| JP | 2003-233001 | 8/2003 |
| JP | 2004-252359 A | 9/2004 |
| JP | 2004-252363 | 9/2004 |
| JP | 2008-176326 | 7/2008 |
| TW | 2004 23228 | 11/2004 |
| TW | 2008 39286 | 10/2008 |

OTHER PUBLICATIONS

Korean Office Action, with translation thereof, for corresponding KR Appl No. 10-2011-7020216, dated Apr. 16, 2013.
Chinese office action, with English translation thereof, for corresponding CN Appl No. 2010 80007425.5, dated May 6, 2013.
Chinese office action, with English translation, for corresponding CN Appl No. 2010 8000 7425.5, dated Jan. 21, 2014.
English translation of JP 2004-252359, published on Sep. 9, 2004.
English translation and Japanese office action for corresponding JP Appl. No. JP 2011-549464, dated Dec. 26, 2012.
Chinese office action, with translation thereof, for corresponding CN Appl No. 201080007424.0, dated May 31, 2013.
The International Search Report for the corresponding PCT Application No. PCT/EP2010/000602, dated May 20, 2010.
The German Examination Report, with English translation, for corresponding DE Appl No. 10 2009 008 644.7, dated Sep. 30, 2009.
Chinese office action with English translation with respect to Chinese patent application No. 2010 8000 7424.0, dated Mar. 19, 2014.
Taiwanese office action with English translation with respect to Taiwanese patent application No. 99 104 350, dated Jan. 21, 2014.
Korean office action with English translation with respect to Korean patent application No. 10-2011-7019945, dated Oct. 23, 2013.
Chinese office action, with English translation thereof, for CN Appl No. 2010 8000 7424.0, dated Nov. 3, 2104.
Chinese Office Action with English translation thereof for corresponding CN Appln. No. 2010 8000 7425.5, dated Jun. 3, 2015.
Chinese office action and Search Report, with English translation thereof, for corresponding CN Appl No. 2010 8000 7425.5, dated Jan. 28, 2016.
Chinese office action and Search Report, with English translation thereof, for corresponding CN Appl No. 201510420110.8, dated Sep. 27, 2017.

* cited by examiner

IMAGING OPTICAL SYSTEM AND PROJECTION EXPOSURE INSTALLATION FOR MICROLITHOGRAPHY WITH AN IMAGING OPTICAL SYSTEM OF THIS TYPE

CROSS-REFERENCE TO RELATED APPLICATIONS

This application is a continuation of, and claims benefit under 35 USC 120 to, international application PCT/EP2010/000602, filed Feb. 2, 2010, which claims benefit under 35 USC 119 of German Application No. 10 2009 008 644.7, filed Feb. 12, 2009 and under 35 USC 119(e) of U.S. Ser. No. 61/151,871, filed Feb. 12, 2009 and U.S. Ser. No. 61/264,472, filed Nov. 25, 2009. International application PCT/EP2010/000602 is hereby incorporated by reference in its entirety.

FIELD

The disclosure relates to an imaging optical system with a plurality of mirrors, which image an object field in an object plane into an image field in an image plane. Furthermore, the disclosure relates to a projection exposure installation with an imaging optical system of this type, a method for producing a microstructured or nanostructured component with a projection exposure system of this type, and a microstructured or nanostructured component produced by this method.

BACKGROUND

Imaging optical systems are known from US 2006/0232867 A1 and US 2008/0170310 A1.

SUMMARY

The disclosure provides an imaging optical system having a combination of small imaging errors, manageable production and good throughput for the imaging light are achieved.

According to the disclosure, it is recognised that without relatively large losses in the imaging quality, it is possible, in a pupil-obscured system, in other words in an imaging optical system with a pupil obscuration, to configure the penultimate mirror with a continuous reflective face, in other words without a through-opening within the optically used region of the penultimate mirror. This facilitates the production of this penultimate mirror with an adequate mirror thickness and also allows an adequately large spacing between the side of the penultimate mirror facing the image plane and the image plane while at the same time minimising the size of the pupil obscuration. This facilitation of production is particularly important if this penultimate mirror is arranged on a mirror body and/or a mirror carrier which is thin in comparison to the other mirrors.

The numerical value for the pupil obscuration is produced by the ratio of the area within the exit pupil masked because of the pupil obscuration relative to a total area of an exit pupil of the imaging optical system. A pupil obscuration, which is less than 5%, makes possible a pupil obscured imaging optical system with a particularly high light throughput. Furthermore, the small obscuration according to the disclosure may lead to a small or negligible influence on an imaging quality of the imaging optical system, in particular on the imaging contrast. The pupil obscuration may be less than 10%. The pupil obscuration may, for example, be 4.4% or 4.0%. The pupil obscuration may be less than 4%, may be less than 3%, may be less than 2% and may even be less than 1%. The pupil obscuration of the imaging optical system may be predetermined by one of the mirrors, for example by a through-opening thereof or by an outer edging thereof, or by an obscuration stop or diaphragm, which is arranged in the beam path of the imaging light between the object field and the image field.

At least one of the mirrors of the imaging optical system according to one of the two aspects described above may have a reflection face, which is designed as a free-form face which cannot be described by a rotationally symmetrical function.

A working spacing of the penultimate mirror additionally facilitates its production. The working spacing may be at least 22 mm, at least 40 mm, at least 60 mm, at least 80 mm and may even be 85 mm. Even larger values for the working spacing are possible. The working spacing is defined as the spacing between the image plane and the portion closest thereto of a used reflection face of the closest mirror, in other words the penultimate mirror of the projection optical system. The image plane is the field plane, which is adjacent to the penultimate mirror, of the imaging optical system.

A maximum angle of incidence facilitates the configuration of a highly reflective coating on this mirror. This is advantageous, in particular, if imaging light with a small wavelength is used, for example with DUV (Deep Ultraviolet), VUV (Vacuum Ultraviolet), or EUV (Extreme Ultraviolet) wavelengths. A multi-layer coating with a small acceptance band width of the angle of incidence and a correspondingly high reflection may then be used, in particular. The maximum angle of incidence of the imaging light on the penultimate mirror in the beam path may be 34.5°, 30°, 25°, 20°, 16.9° or 15.9° in the meridional section of the imaging optical system.

An arrangement of the penultimate mirror leads to the possibility that a holder, which holds this penultimate mirror and mirrors of the imaging beam path in front of the imaging beam path section, between the third to last mirror and the penultimate mirror, may be relatively compact in design.

As an alternative to this, an arrangement of the penultimate mirror is possible.

An arrangement of the third to last and the sixth to last mirror back to back leads to a compact structure of the imaging optical system with good utilisation of the installation space.

Basically, instead of a back to back mirror arrangement, an arrangement is also possible in which reflection faces are provided on both sides of a monolithic base body, which correspond to the mirror faces of the mirror arrangement then replaced.

At least one intermediate image leads to the possibility of guiding an imaging beam path section of the beam path of the imaging light between the object field and the image field closely past further components of the imaging optical system. The intermediate image may, in particular, be arranged in the region of the through-opening of the last mirror, which makes a small pupil obscuration possible. The imaging optical system may also have more than one intermediate image and may, in particular, have two intermediate images in the beam path of the imaging light between the object field and the image field.

A plurality of intermediate images may also be used to for correcting imaging errors or simplifying the design of the mirror forms involved.

At least one crossing or intersection region allows compact beam guidance. The imaging optical system may also have more than one intersection region of this type, in particular two, three or four intersection regions, between imaging beam path sections. One or all of the intersection regions may spatially overlap one another at least in portions. An intersection region is taken to mean the region in which the imaging beam path sections intersect in total. In the reflection on a mirror, the imaging beam path sections therefore, according to definition, do not intersect in an intersection region of this type.

A numerical aperture allows high resolution of the imaging optical system. The numerical aperture may be at least 0.4 and may also be at least 0.5.

A rectangular field facilitates the conducting of the lithography process when using the imaging optical system. A rectangular field of this type may be achieved, in particular, by the use of non-rotationally symmetrical free-form faces as reflection faces of the mirrors of the imaging optical system. At least one of the mirrors may be configured as a free-form face of this type. The image field may have dimensions of 2 mm×26 mm or of 2.5 mm×26 mm.

When using the imaging optical system as a projection optical system its advantages stand out, in particular.

The imaging optical system according to the disclosure may have precisely six mirrors.

The advantages of a projection exposure installation according to the disclosure correspond to those which were stated above with respect to the imaging optical system according to the disclosure. The light source of the projection exposure installation may be wide band in design and for example have a band width, which may be greater than 1 nm, which is greater than 10 nm or which is greater than 100 nm. In addition, the projection exposure installation may be designed such that it can be operated with light sources of different wavelengths. Light sources for other wavelengths used, in particular, for microlithography, can be used in conjunction with the imaging optical system according to the disclosure, for example light sources with the wavelengths 365 nm, 248 nm, 193 nm, 157 nm, 126 nm, 109 nm and, in particular, also with wavelengths, which are less than 100 nm, for example between 5 nm and 30 nm.

The light source of the projection exposure installation may be configured to produce illumination light with a wavelength of between 5 nm and 30 nm. A light source of this type uses reflection coatings on the mirrors which, in order to fulfil a minimum reflectivity, have only a small angle of incidence acceptance band width. Together with the imaging optical system according to the disclosure, this desire a small angle of incidence acceptance band width can be fulfilled.

Corresponding advantages apply to a production method according to the disclosure and the microstructured or nanostructured component produced thereby.

BRIEF DESCRIPTION OF THE DRAWINGS

An embodiment of the disclosure will be described in more detail below with the aid of the drawings, in which.

DETAILED DESCRIPTION

Figure 1:
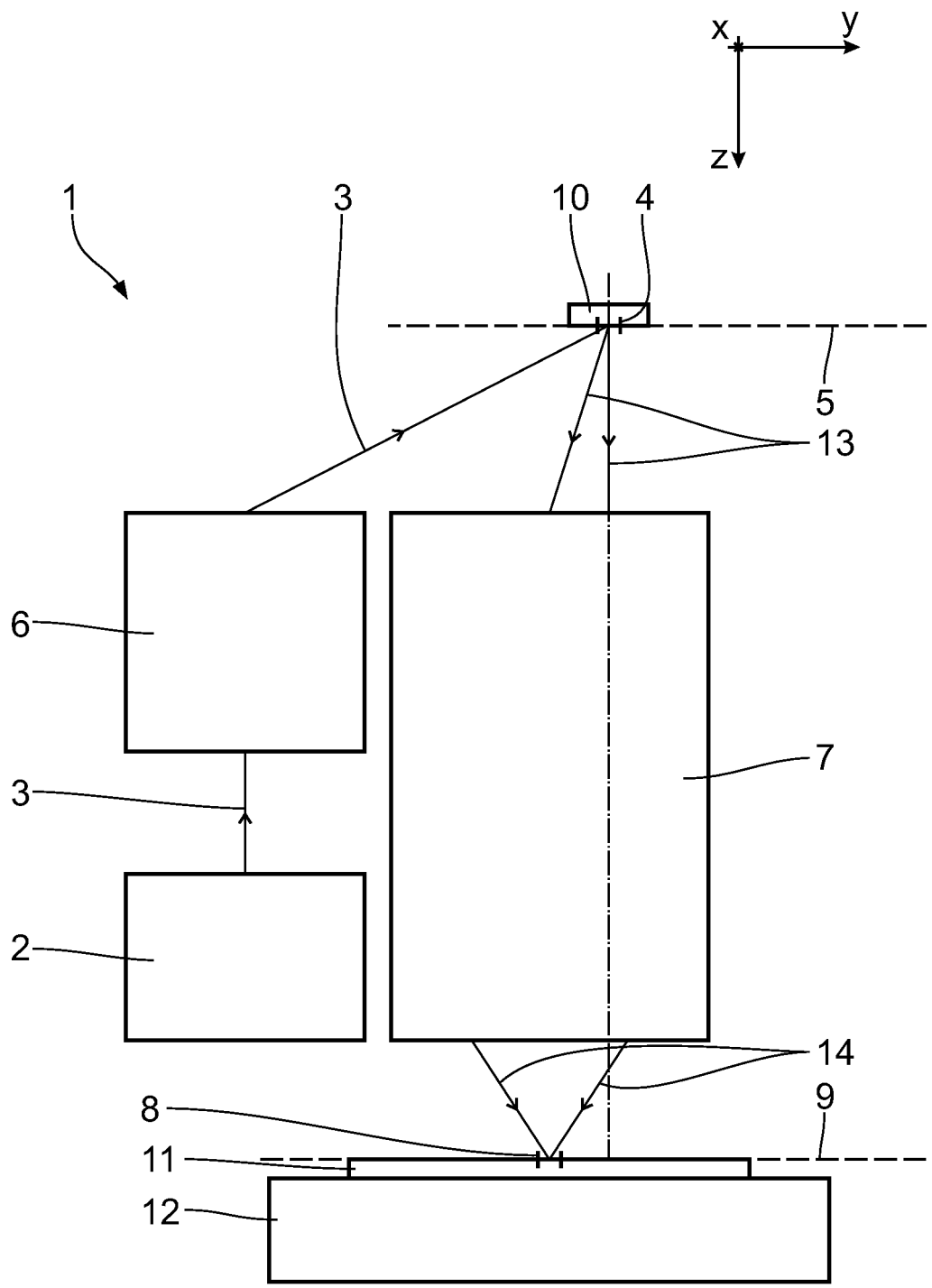
FIG. 1 schematically shows a projection exposure installation for EUV microlithography.

A projection exposure installation 1 for microlithography has a light source 2 for illumination light or imaging light 3. The light source 2 is an EUV light source which produces light in a wavelength range of, for example, between 5 nm and 30 nm, in particular between 5 nm and 15 nm. The light source 2 may, in particular, be a light source with a wavelength of 13.5 nm or a light source with a wavelength of 6.9 nm. Other EUV wavelengths are also possible. In general, any wavelengths, for example visible wavelengths or else other wavelengths, which can be used in microlithography and are available for the suitable laser light sources and/or LED light sources (for example 365 nm, 248 nm, 193 nm, 157 nm, 129 nm, 109 nm), are even possible for the illumination light 3 guided in the projection exposure installation 1. A beam path of the illumination light 3 is shown extremely schematically in FIG. 1.

An illumination optical system 6 is used to guide the illumination light 3 from the light source 2 to an object field 4 in an object plane 5. The object field 4 is imaged in an image field 8 in an image plane 9 with the predetermined reduction scale using a projection optical system or an imaging optical system 7. The image field 8, in the x-direction, has an extent of 26 mm and, in the y-direction, an extent of 2 mm. The object field 4 and the image field 8 are rectangular. One of the embodiments shown in FIG. 2 ff. can be used for the projection optical system 7. The projection optical system 7 according to FIG. 2 reduces by a factor of 4. Other reduction scales are also possible, for example 5×, 8× or else reduction scales which are greater than 8×. The image plane 9, in the projection optical system 7 in the embodiments according to FIG. 2 ff. is arranged parallel to the object plane 5. Imaged here is a portion, which coincides with the object field 4, of a reflection mask 10, which is also called a reticle.

Figure 2:
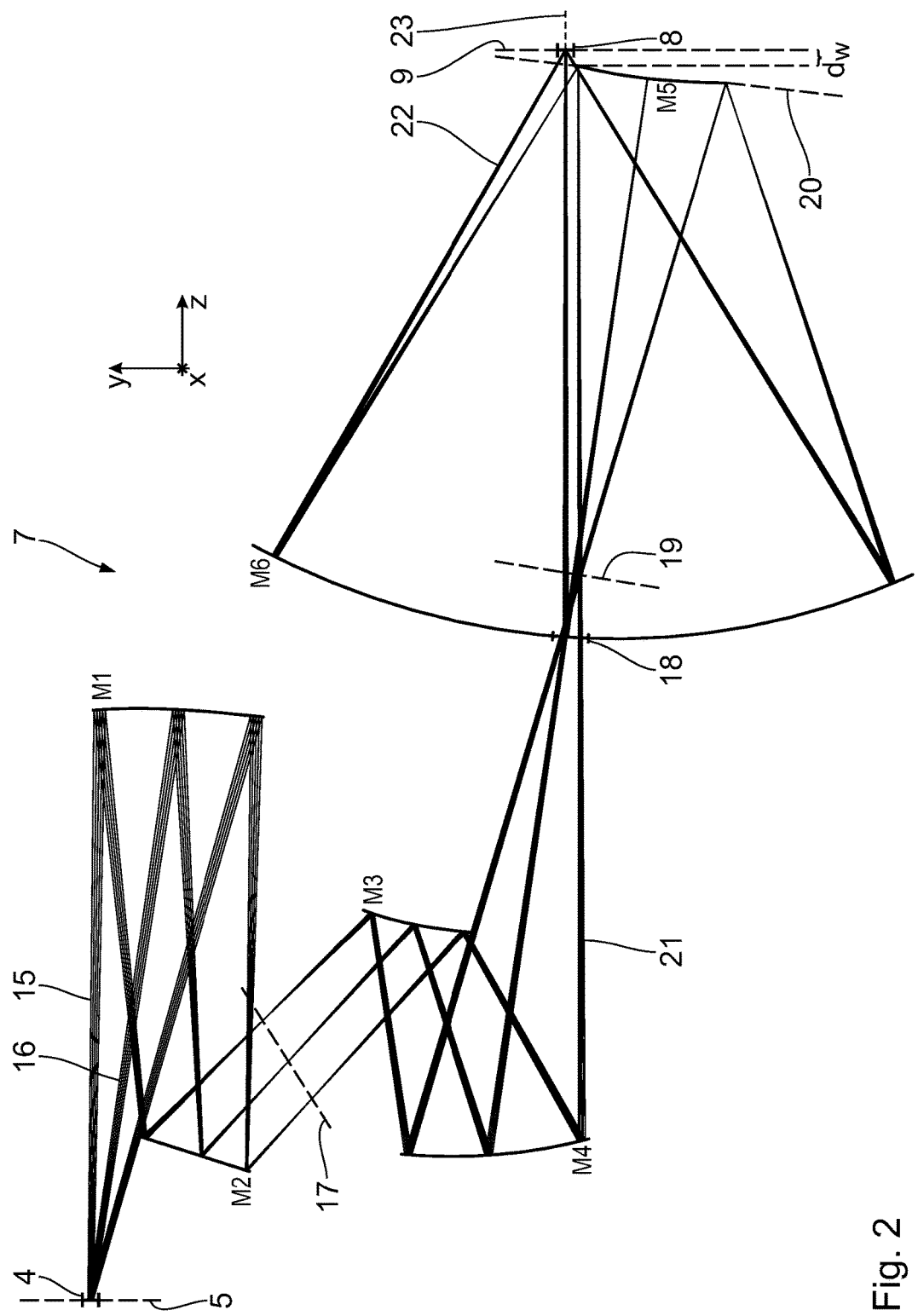
FIG. 2 shows, in a meridional section, an embodiment of an imaging optical system, which can be used as a projection lens system in the projection exposure installation according to FIG. 1, the imaging beam path being shown (virtually) for the main beams and being shown for the upper and lower coma beam of a plurality of selected field points.

The imaging by the projection optical system 7 takes place on the surface of a substrate 11 in the form of a wafer, which is carried by a substrate holder 12. FIG. 1 schematically shows, between the reticle 10 and the projection optical system 7, a beam concentration 13 of the illumination light 3 running therein, and, between the projection optical system 7 and the substrate 11, a beam concentration 14 of the illumination light 3 leaving the projection optical system 7. A numerical aperture (NA) on the image field side of the projection optical system 7 in the embodiment according to FIG. 2 is 0.50. This is not represented to scale in FIG. 1.

To facilitate the description of the projection exposure installation 1 and the various embodiments of the projection optical system 7, a Cartesian xyz-coordinate system is given in the drawing, from which the respective position reference of the components shown in the figures emerges. In FIG. 1, the x-direction runs perpendicular to the plane of the drawing and into it. The y-direction extends to the right and the z-direction downward.

The projection exposure installation 1 is of the scanner type. Both the reticle 10 and the substrate 11 are scanned during operation of the projection exposure installation 1 in the y-direction. A stepper type of the projection exposure installation 1, in which a stepwise displacement of the reticle 10 and the substrate 11 in the y-direction takes place in between individual exposures of the substrate 11, is possible.

FIG. 2 shows the optical design of a first embodiment of the projection optical system 7. FIG. 2 shows the beam path of three respective individual beams 15, which issue from five object field points spaced apart from one another in the y-direction in FIG. 2. The three individual beams 15, which belong to one of these five object field points, are in each case associated with three different illumination directions for the two object field points. Main beams 16, which run through the centre of a pupil in a pupil plane 17 of the projection optical system 7, are drawn in FIG. 2 only for graphical reasons as these are not real, but virtual imaging beam paths of the projection optical system 7 because of a central pupil obscuration of the projection optical system 7. These main beams 16 firstly run divergently, proceeding from the object plane 5. This is also called a negative back focal distance of an entry pupil of the projection optical system 7 below. The entry pupil of the projection optical system 7 according to FIG. 2 is not located within the projection optical system 7, but in the beam path in front of the object plane 5. This makes it possible, for example, to arrange a pupil component of the illumination optical system 6 in the entry pupil of the projection optical system 7 in the beam path in front of the projection optical system 7, without further imaging optical components having to be present between this pupil component and the object plane 5.

The projection optical system 7 according to FIG. 2 has a total of six mirrors, which are numbered consecutively by M1 to M6 in the order of their arrangement in the beam path of the individual beams 15, proceeding from the object field 4. FIG. 2 shows the calculated reflection faces of the mirrors M1 to M6 or M5, M6. Only a small region of these calculated reflection faces is used, as can be seen in the view of FIG. 2. Only this actually used region of the reflection faces is actually present in the real mirrors M1 to M6. These useful reflection faces are carried in a known manner by mirror bodies.

All six mirrors M1 to M6 of the projection optical system 7 are designed as free-form faces which cannot be described by a rotationally symmetrical function. Other embodiments of the projection optical system 7 are also possible, in which at least one of the mirrors M1 to M6 has a free-form reflection face of this type.

A free-form face of this type may also be produced from a rotationally symmetrical reference face. Free-form faces of this type for reflection faces of the mirrors of projection optical systems of projection exposure installation for microlithography are known from US 2007-0058269 A1.

The free-form face can be described mathematically by the following equation:

$$Z = \frac{cr^2}{1 + \sqrt{1 - (1+k)c^2 r^2}} + \sum_{j=2}^{N} C_j X^m Y^n \quad (1)$$

wherein there applies:

$$j = \frac{(m+n)^2 + m + 3n}{2} + 1 \quad (2)$$

Z is the rising height (sagitta) of the free-form face at the point x, y ($x^2+y^2=r^2$).

c is a constant, which corresponds to the vertex curvature of a corresponding asphere. k corresponds to a conical constant of a corresponding asphere. $C_j$ are the coefficients of the monomials $X^m Y^n$. Typically, the values of c, k and $C_j$ are determined on the basis of the desired optical properties of the mirror within the projection optical system 7. The order of the monomial, m+n, may be varied as desired. A monomial of a higher order may lead to a design of the projection optical system with improved image error correction, but is more complex to calculate. m+n may adopt values of between 3 and more than 20.

Free-form faces can also be described mathematically by Zernike polynomials, which are described, for example, in the manual of the optical design programme CODE V®. Alternatively, free-form faces may be described with the aid of two-dimensional spline surfaces. Examples of this are Bezier curves or non-uniform rational basis splines (NURBS). Two-dimensional spline surfaces may, for example, be described by a network of points in an xy-plane and associated z-values or by these points and gradients associated with them. Depending on the respective type of spline surface, the complete surface is obtained by interpolation between the network points using, for example, polynomials or functions, which have specific properties with regard to their continuity and differentiability. Examples of this are analytical functions.

The mirrors M1 to M6 have multiple reflection layers to optimise their reflection for the impinging EUV illumination light 3. The reflection can be optimised all the better, the closer the impingement angle of the individual beams 15 on the mirror surface lies to the perpendicular incidence. The projection optical system 7 has small reflection angles overall for all the individual beams 15.

The optical design data of the reflection faces of the mirrors M1 to M6 of the projection optical system 7 can be inferred from the following tables. The first of these tables gives, for the optical surfaces of the optical components and for the aperture diaphragm, the respective reciprocal value of the vertex curvature (radius) and a spacing value (thickness), which corresponds to the z-spacing of adjacent elements in the beam path, proceeding from the object plane. The second table gives the coefficients $C_j$ of the monomials $X^m Y^n$ in the free-form face equation given above for the mirrors M1 to M6. Nradius is in this case a standardisation factor. According to the second table, the amount is still given in mm, along which the respective mirror, proceeding from a mirror reference design, has been decentred (Y-decentre) and rotated (X-rotation). This corresponds to a parallel displacement and a tilting in the free-form face design method. The displacement takes place here in the y-direction and the tilting is about the x-axis. The rotation angle is given in degrees here.

| Surface | Radius | Spacing value | Operating mode |
|---|---|---|---|
| Object plane | INFINITE | 815.666 | |
| M1 | −1153.305 | −615.656 | REFL |
| M2 | 222.516 | 319.520 | REFL |
| M3 | 382.480 | −319.520 | REFL |
| M4 | 558.747 | 1485.905 | REFL |
| M5 | 701.517 | −770.248 | REFL |
| M6 | 875.932 | 810.223 | REFL |
| Image plane | INFINITE | 0.000 | |

| Coefficient | M1 | M2 | M3 | M4 | M5 | M6 |
|---|---|---|---|---|---|---|
| K | −2.605966E+00 | −5.961575E−01 | 1.802738E+00 | −4.147176E−01 | 5.283440E+00 | −8.773495E−03 |
| Y | 0.000000E+00 | 0.000000E+00 | 0.000000E+00 | 0.000000E+00 | 0.000000E+00 | 0.000000E+00 |
| X2 | 9.076785E−06 | −2.333474E−03 | 9.771997E−05 | −1.351961E−04 | −3.072793E−04 | −3.218741E−05 |
| Y2 | −1.262804E−05 | −2.351151E−03 | −4.280681E−04 | −2.063652E−04 | −4.778011E−05 | −1.825268E−05 |
| X2Y | 5.547212E−08 | 1.113508E−06 | 1.714986E−06 | 4.601654E−08 | −7.454541E−07 | −3.779820E−09 |
| Y3 | 7.260181E−08 | 9.449646E−07 | 1.271140E−06 | 8.751761E−08 | −2.182587E−07 | 4.618324E−09 |
| X4 | −2.717367E−10 | −5.643202E−09 | 1.100027E−10 | 2.753993E−11 | 1.011144E−10 | −1.051777E−11 |
| X2Y2 | −4.717758E−10 | −1.285056E−08 | −1.176444E−08 | −6.509076E−11 | −5.621785E−10 | −2.181974E−11 |
| Y4 | −1.535374E−10 | −5.716571E−09 | −8.317888E−09 | −1.255759E−10 | 1.083353E−10 | −7.220214E−12 |
| X4Y | 4.620639E−14 | 2.908858E−12 | −2.838235E−11 | −5.428510E−14 | −3.027549E−13 | 2.004008E−15 |
| X2Y3 | 1.354365E−13 | 2.499768E−12 | −4.853945E−11 | 1.768342E−14 | 3.032599E−12 | 4.901143E−15 |
| Y5 | 9.758474E−14 | −8.026135E−12 | −2.371972E−11 | 1.039111E−13 | 6.346065E−12 | 6.164413E−15 |
| X6 | −1.650739E−19 | −1.746162E−14 | −4.622947E−14 | 4.561474E−17 | −1.475643E−15 | −4.982818E−18 |
| X4Y2 | 1.411917E−16 | −4.021338E−14 | −1.679149E−13 | 4.396111E−16 | −2.334912E−15 | −7.006257E−18 |
| X2Y4 | 4.293001E−16 | 3.421095E−14 | −2.624283E−13 | 4.785171E−16 | 2.028609E−14 | −2.259935E−18 |
| Y6 | 3.538529E−16 | 1.283163E−14 | 3.276365E−14 | 9.873439E−16 | 1.117653E−14 | 8.963014E−19 |
| X6Y | −2.078486E−19 | −1.183867E−16 | −3.132075E−16 | 2.806498E−19 | 1.669547E−17 | 3.910845E−21 |
| X4Y3 | −2.392439E−19 | −3.921710E−16 | −1.722114E−16 | 3.083030E−19 | 2.773189E−17 | 1.616941E−20 |
| X2Y5 | 3.774411E−19 | −4.353032E−16 | 4.633354E−16 | 1.078201E−18 | 2.004813E−17 | 1.540131E−20 |
| Y7 | −7.122980E−18 | −3.967812E−17 | 6.639885E−16 | −2.211631E−18 | −8.876500E−17 | 4.032079E−21 |
| X8 | −1.403258E−22 | −5.276488E−20 | −1.503485E−18 | 1.126741E−22 | −3.102183E−20 | −3.780424E−24 |
| X6Y2 | −1.352342E−21 | 5.134116E−19 | −9.187180E−18 | −4.302896E−22 | 3.184593E−20 | −4.432214E−24 |
| X4Y4 | −2.843591E−21 | 8.052424E−19 | −1.538670E−17 | 4.879150E−22 | 1.108150E−20 | 1.149988E−24 |
| X2Y6 | 3.933427E−21 | 2.988855E−19 | −7.353139E−18 | −1.034931E−20 | −1.498632E−19 | 1.296327E−24 |
| Y8 | −1.881220E−20 | −5.733234E−19 | −1.441529E−18 | 2.416028E−21 | −4.165554E−19 | −1.440139E−24 |
| X8Y | 0.000000E+00 | 0.000000E+00 | 0.000000E+00 | 0.000000E+00 | 0.000000E+00 | 0.000000E+00 |
| X6Y3 | 0.000000E+00 | 0.000000E+00 | 0.000000E+00 | 0.000000E+00 | 0.000000E+00 | 0.000000E+00 |
| X4Y5 | 0.000000E+00 | 0.000000E+00 | 0.000000E+00 | 0.000000E+00 | 0.000000E+00 | 0.000000E+00 |
| X2Y7 | 0.000000E+00 | 0.000000E+00 | 0.000000E+00 | 0.000000E+00 | 0.000000E+00 | 0.000000E+00 |
| Y9 | 0.000000E+00 | 0.000000E+00 | 0.000000E+00 | 0.000000E+00 | 0.000000E+00 | 0.000000E+00 |
| X10 | 0.000000E+00 | 0.000000E+00 | 0.000000E+00 | 0.000000E+00 | 0.000000E+00 | 0.000000E+00 |
| X8Y2 | 0.000000E+00 | 0.000000E+00 | 0.000000E+00 | 0.000000E+00 | 0.000000E+00 | 0.000000E+00 |
| X6Y4 | 0.000000E+00 | 0.000000E+00 | 0.000000E+00 | 0.000000E+00 | 0.000000E+00 | 0.000000E+00 |
| X4Y6 | 0.000000E+00 | 0.000000E+00 | 0.000000E+00 | 0.000000E+00 | 0.000000E+00 | 0.000000E+00 |
| X2Y8 | 0.000000E+00 | 0.000000E+00 | 0.000000E+00 | 0.000000E+00 | 0.000000E+00 | 0.000000E+00 |
| Y10 | 0.000000E+00 | 0.000000E+00 | 0.000000E+00 | 0.000000E+00 | 0.000000E+00 | 0.000000E+00 |
| Nradius | 1.000000E+00 | 1.000000E+00 | 1.000000E+00 | 1.000000E+00 | 1.000000E+00 | 1.000000E+00 |

| Coefficient | M1 | M2 | M3 | M4 | M5 | M6 | Image plane |
|---|---|---|---|---|---|---|---|
| Y-decentre | −4.633 | −32.903 | −307.827 | −405.254 | −609.190 | −503.476 | 0.000 |
| X-rotation | −2.685 | −19.040 | −11.876 | 4.571 | −7.815 | −3.906 | 0.000 |

The mirrors M1, M2, M4 and M6 are configured as concave mirrors. The radius of curvature of the mirror M2 is so large that it almost looks like a planar mirror in FIG. 2. The mirrors M3 and M5 are configured as convex mirrors.

The mirrors M1 and M6 and M3 and M6 are arranged back to back with regard to the orientation of their reflection faces.

The optically used regions of the mirrors M1 to M5 have no through-opening within the optically used region for the passage of imaging light, in other words are not obscured. The mirror M5, in other words the penultimate mirror in the beam path of the illumination light 3 between the object field 4 and the image field 8, also has no through-opening for the passage of the imaging light or illumination light 3. The mirror M5, in other words, has an uninterrupted used reflection face.

In the imaging beam path between the mirrors M4 and M5, the individual beams 15 pass through a through-opening 18 in the mirror M6. The mirror M6 is used around the through-opening 18. The mirror M6 is thus an obscured mirror.

The pupil plane 17, in the imaging beam path in the projection optical system 7, lies between the mirrors M2 and M3. The pupil plane 17 also lies in the imaging beam path between the object field 4 and the through-opening 18 of the mirror M6. An obscuration stop or diaphragm for central shading of a pupil of the projection optical system 7 may be arranged in the pupil plane 17. The obscuration diaphragm thus shades the central region of the imaging light 3 in the pupil plane 17 which does not contribute to the imaging of the object field 4 because of the through-opening 18.

An intermediate image plane 19 of the projection optical system 7 is located in the imaging beam path between the mirrors M4 and M5. The associated intermediate image is located adjacent to the through-opening 18 in the mirror M6. As a result it is possible to make this through-opening 18 small in comparison to the used reflection face of the mirror M8. A central pupil obscuration, in other words the ratio of an area blanked by the through-opening 18 or the obscuration diaphragm in the pupil plane 17 within an exit pupil of the projection optical system 7 relative to an overall face of this exit pupil, is 4.4% in the projection optical system 7.

A working spacing $d_w$ between the image plane 9 and the portion closest to the image plane of a used reflection face of the mirror M5 is 22 mm. A ratio of this working spacing $d_w$ to the overall length of the projection optical system 7, in other words to the spacing between the object field 4 and the image field 8, is 1.3%.

A further pupil plane 20 of the projection optical system 7 is located in the imaging beam path in the region of the mirror M5. A diaphragm may also be arranged here.

The angle of incidence of the individual beams 15 on the mirror M3 in the meridional plane, which is shown in FIG. 2, is a maximum of 34.5°.

An imaging beam path section 21 runs between the third to last mirror M4 in the imaging beam path and the penultimate mirror M5 in the imaging beam path. This imaging beam path section 21 begins at the reflection on the mirror M4 and ends at the reflection on the mirror M5. The imaging beam path in the projection optical system 7 in front of the imaging beam path section 21, in other words the imaging beam path between the object field 4 and the mirror M4, on the one hand, and an imaging light bundle 22 in the region of the image field 8, on the other hand, are guided on the same side of the imaging beam path section 21. Accordingly, the object field 4 and the penultimate mirror M5 are arranged on different sides of a main plane 23 which extends centrally through the image field 8 and is perpendicular to the meridional plane, in other words the plane of the drawing of FIGS. 2 to 4.

Figure 3:
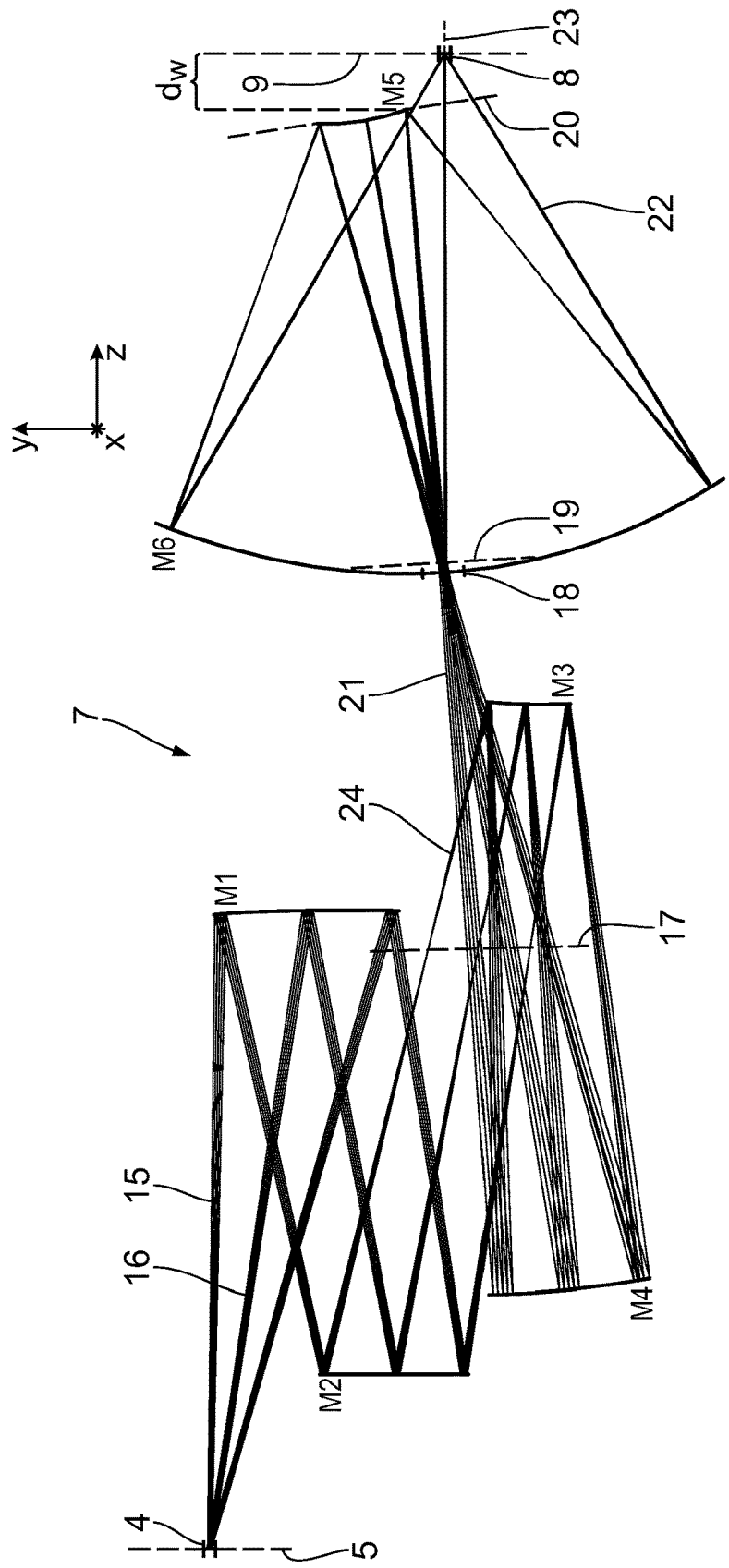
FIGS. 3 to 21 show further embodiments of the imaging optical system in a view similar to FIG. 2.

FIG. 3 shows a further embodiment of the projection optical system 7. Components, which correspond to those of the projection optical system 7 according to FIG. 2, have the same reference numerals and are not discussed again in detail.

The optical design data of the projection optical system 7 according to FIG. 3 can be inferred from the following tables, which correspond to the tables on the projection optical system 7 according to FIG. 2 with respect to their structure.

| Surface | Radius | Spacing value | Operating mode |
|---|---|---|---|
| Object plane | INFINITE | 986.270 | |
| M1 | −815.021 | −716.283 | REFL |
| M2 | −1692.737 | 1034.499 | REFL |
| M3 | 805.634 | −904.485 | REFL |
| M4 | 1745.655 | 1800.135 | REFL |
| M5 | 186.402 | −695.651 | REFL |
| M6 | 818.011 | 795.967 | REFL |
| Image plane | INFINITE | 0.000 | |

| Coefficient | M1 | M2 | M3 | M4 | M5 | M6 | Image plane |
|---|---|---|---|---|---|---|---|
| K | −1.238679E−01 | −1.791231E+01 | −1.198325E+00 | −2.530823E−01 | −1.020467E−02 | 5.662681E−02 | |
| X2 | 1.225388E−04 | −1.219365E−03 | −9.215303E−04 | −2.476431E−04 | −1.451018E−03 | −6.707230E−06 | |
| Y2 | 3.086233E−04 | 3.281365E−04 | −2.291446E−04 | 5.508666E−05 | −1.225948E−03 | −2.358417E−06 | |
| X2Y | 3.520023E−08 | −2.237558E−06 | 4.383580E−08 | −5.980784E−10 | 1.944652E−06 | 5.208464E−10 | |
| Y3 | −3.914904E−09 | 8.665292E−08 | 3.997990E−07 | 5.130872E−09 | −9.275351E−07 | −5.831866E−09 | |
| X4 | 5.262082E−11 | −5.336536E−08 | 2.120561E−11 | −2.198962E−11 | −7.191540E−09 | 6.478133E−13 | |
| X2Y2 | 1.459216E−10 | −7.004312E−10 | 5.077070E−10 | 1.326969E−10 | −1.229590E−08 | −1.283249E−12 | |
| Y4 | 1.690794E−10 | −3.956379E−10 | 6.068550E−10 | 2.595291E−11 | −4.780182E−09 | −3.237182E−12 | |
| X4Y | −2.099690E−14 | −1.842852E−11 | 1.225213E−13 | 1.180341E−13 | 1.310535E−11 | −2.534706E−15 | |
| X2Y3 | 3.021789E−14 | −1.362668E−11 | −4.690792E−13 | −1.357904E−13 | 1.637678E−11 | −8.678287E−16 | |
| Y5 | 1.894306E−13 | 2.933573E−13 | −6.894643E−12 | −5.680668E−14 | −6.265372E−12 | −1.795660E−15 | |
| X6 | 0.000000E+00 | 0.000000E+00 | 0.000000E+00 | 0.000000E+00 | 0.000000E+00 | 0.000000E+00 | |
| X4Y2 | 0.000000E+00 | 0.000000E+00 | 0.000000E+00 | 0.000000E+00 | 0.000000E+00 | 0.000000E+00 | |
| X2Y4 | 0.000000E+00 | 0.000000E+00 | 0.000000E+00 | 0.000000E+00 | 0.000000E+00 | 0.000000E+00 | |
| Y6 | 0.000000E+00 | 0.000000E+00 | 0.000000E+00 | 0.000000E+00 | 0.000000E+00 | 0.000000E+00 | |
| X6Y | 0.000000E+00 | 0.000000E+00 | 0.000000E+00 | 0.000000E+00 | 0.000000E+00 | 0.000000E+00 | |
| X4Y3 | 0.000000E+00 | 0.000000E+00 | 0.000000E+00 | 0.000000E+00 | 0.000000E+00 | 0.000000E+00 | |
| X2Y5 | 0.000000E+00 | 0.000000E+00 | 0.000000E+00 | 0.000000E+00 | 0.000000E+00 | 0.000000E+00 | |
| Y7 | 0.000000E+00 | 0.000000E+00 | 0.000000E+00 | 0.000000E+00 | 0.000000E+00 | 0.000000E+00 | |
| X8 | 0.000000E+00 | 0.000000E+00 | 0.000000E+00 | 0.000000E+00 | 0.000000E+00 | 0.000000E+00 | |
| X6Y2 | 0.000000E+00 | 0.000000E+00 | 0.000000E+00 | 0.000000E+00 | 0.000000E+00 | 0.000000E+00 | |
| X4Y4 | 0.000000E+00 | 0.000000E+00 | 0.000000E+00 | 0.000000E+00 | 0.000000E+00 | 0.000000E+00 | |
| X2Y6 | 0.000000E+00 | 0.000000E+00 | 0.000000E+00 | 0.000000E+00 | 0.000000E+00 | 0.000000E+00 | |
| Y8 | 0.000000E+00 | 0.000000E+00 | 0.000000E+00 | 0.000000E+00 | 0.000000E+00 | 0.000000E+00 | |
| X8Y | 0.000000E+00 | 0.000000E+00 | 0.000000E+00 | 0.000000E+00 | 0.000000E+00 | 0.000000E+00 | |
| X6Y3 | 0.000000E+00 | 0.000000E+00 | 0.000000E+00 | 0.000000E+00 | 0.000000E+00 | 0.000000E+00 | |
| X4Y5 | 0.000000E+00 | 0.000000E+00 | 0.000000E+00 | 0.000000E+00 | 0.000000E+00 | 0.000000E+00 | |
| X2Y7 | 0.000000E+00 | 0.000000E+00 | 0.000000E+00 | 0.000000E+00 | 0.000000E+00 | 0.000000E+00 | |
| Y9 | 0.000000E+00 | 0.000000E+00 | 0.000000E+00 | 0.000000E+00 | 0.000000E+00 | 0.000000E+00 | |
| X10 | 0.000000E+00 | 0.000000E+00 | 0.000000E+00 | 0.000000E+00 | 0.000000E+00 | 0.000000E+00 | |
| X8Y2 | 0.000000E+00 | 0.000000E+00 | 0.000000E+00 | 0.000000E+00 | 0.000000E+00 | 0.000000E+00 | |
| X6Y4 | 0.000000E+00 | 0.000000E+00 | 0.000000E+00 | 0.000000E+00 | 0.000000E+00 | 0.000000E+00 | |
| X4Y6 | 0.000000E+00 | 0.000000E+00 | 0.000000E+00 | 0.000000E+00 | 0.000000E+00 | 0.000000E+00 | |
| X2Y8 | 0.000000E+00 | 0.000000E+00 | 0.000000E+00 | 0.000000E+00 | 0.000000E+00 | 0.000000E+00 | |
| Y10 | 0.000000E+00 | 0.000000E+00 | 0.000000E+00 | 0.000000E+00 | 0.000000E+00 | 0.000000E+00 | |
| Nradius | 1.000000E+00 | 0.000000E+00 | 1.000000E+00 | 0.000000E+00 | 1.000000E+00 | 1.000000E+00 | |
| Y-decentre | −28.611 | −158.244 | −344.671 | −406.391 | −114.284 | −227.166 | 0.000 |
| X-rotation | 1.129 | 0.021 | −3.156 | 6.560 | 9.217 | 4.608 | 0.000 |

In the projection optical system 7 according to FIG. 3, the mirror M5, in comparison to the projection optical system 7 according to FIG. 2, is present mirrored about the main plane 23. The penultimate mirror M5 and the object field 4 are arranged on the same side of the main plane 23. The imaging beam path between the object field 4 and the mirror M2, on the one hand, and the imaging light bundle 22 in the region of the image field 8 of the projection optical system 7 according to FIG. 3, on the other hand, are guided on different sides of the imaging beam path section 21. The imaging beam path section 21 and a further imaging beam path section 24 between the mirrors M2 and M3 intersect in the imaging beam path of the projection optical system 7 according to FIG. 3.

In the projection optical system 7 according to FIG. 3, the mirror M2 is configured as a convex mirror. Because of the very large radius of curvature of the mirror M2, the latter appears virtually to be a planar mirror in FIG. 3.

The intermediate image plane 19, in the projection optical system 7 according to FIG. 3, lies practically precisely at the level of the through-opening 18 in the mirror M6.

The central pupil obscuration in the projection optical system 7 according to FIG. 3 is 4.0%. The working spacing $d_w$ between the image plane 9 and the portion of the used reflection face of the mirror M5 closest to the image plane is 85 mm. A radio of this working spacing $d_w$ to the overall length of the projection optical system 7 according to FIG. 3 is 3.7%. The angle of incidence of the individual beams 15 on the mirror M5 in the meridional plane, which is shown in FIG. 3, is a maximum of 16.9°.

Figure 4:
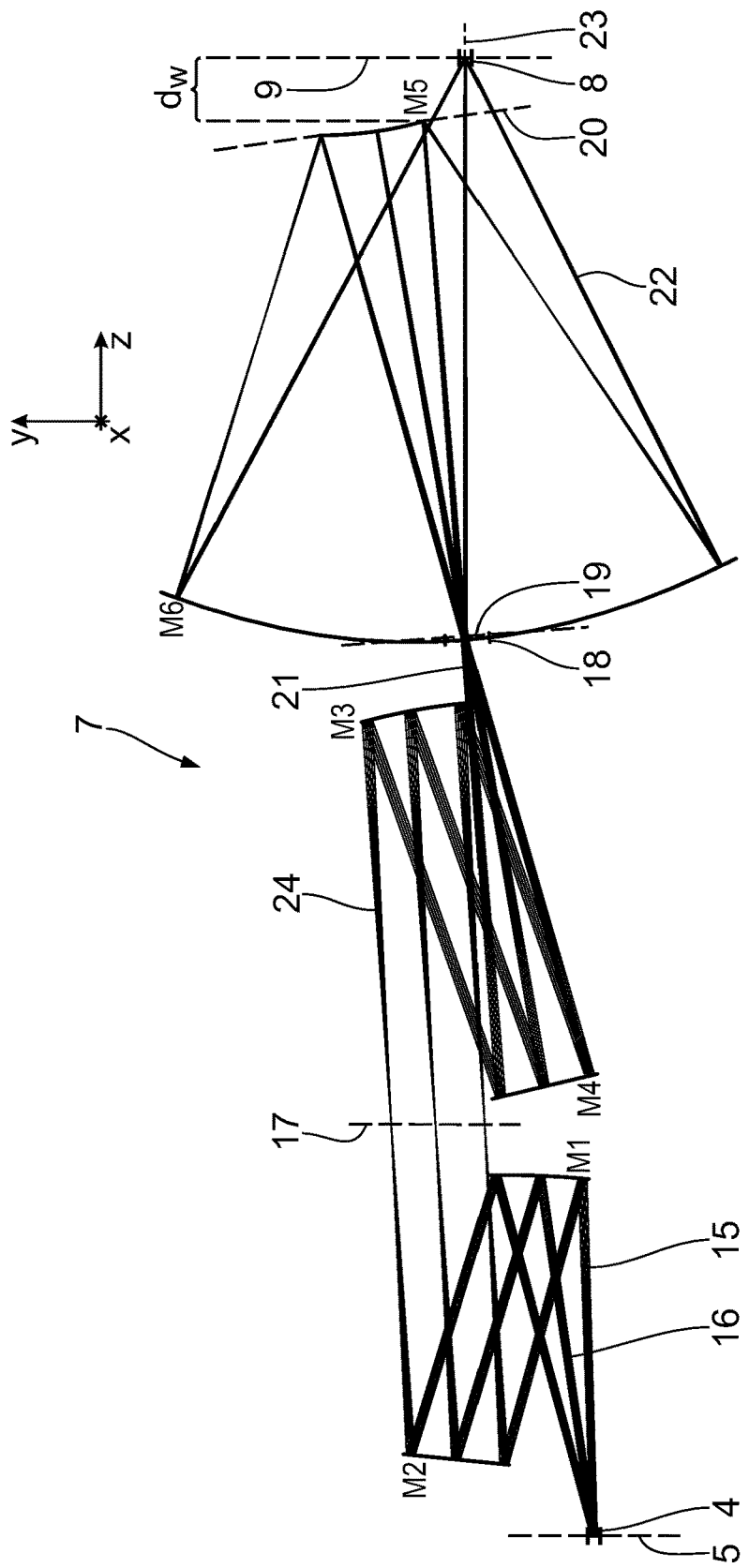

FIG. 4 shows a further embodiment of the projection optical system 7. Components which correspond to those which have already been described above with reference to the projection optical system 7 from FIGS. 2 and 3 have the same reference numerals and are not discussed again in detail.

The optical design data of the projection optical system 7 according to FIG. 4 can be inferred from the following tables, which correspond to the tables on the projection optical system 7 according to FIGS. 2 and 3 with regard to their structure.

| Surface | Radius | Spacing value | Operating mode |
|---|---|---|---|
| Object plane | INFINITE | 485.884 | |
| M1 | 573.309 | −385.884 | REFL |
| M2 | 856.474 | 1014.613 | REFL |
| M3 | −619.480 | −508.729 | REFL |
| M4 | 601.504 | 1294.117 | REFL |
| M5 | 256.986 | −685.388 | REFL |
| M6 | 838.548 | 785.387 | REFL |
| Image plane | INFINITE | 0.000 | |

| Coefficient | M1 | M2 | M3 | M4 | M5 | M6 | Image plane |
|---|---|---|---|---|---|---|---|
| K | −5.356880E−02 | 8.027989E−02 | 2.215137E+00 | −5.038784E−01 | 4.907814E−02 | 1.120410E−01 | |
| Y | 0.000000E+00 | 0.000000E+00 | 0.000000E+00 | 0.000000E+00 | 0.000000E+00 | 0.000000E+00 | |
| X2 | −4.675062E−04 | −2.669898E−05 | 1.839305E−03 | −2.126518E−04 | −9.700568E−04 | 7.232599E−06 | |
| Y2 | −1.320900E−03 | −5.452804E−04 | 7.818071E−04 | −4.431611E−04 | −8.012468E−04 | 1.044012E−05 | |
| X2Y | 1.229247E−06 | 4.121203E−07 | −2.381957E−06 | −9.694733E−08 | −1.199882E−06 | −5.510251E−09 | |
| Y3 | −7.423640E−08 | −8.613636E−08 | 4.979224E−08 | −2.077214E−08 | 1.739231E−07 | −1.476529E−09 | |
| X4 | −2.550932E−10 | −5.351417E−11 | 1.281481E−08 | −4.388472E−11 | −2.188996E−09 | 2.529523E−13 | |
| X2Y2 | −2.178964E−10 | −2.067816E−10 | 8.488864E−09 | −1.254954E−10 | −2.292180E−09 | 2.688243E−13 | |
| Y4 | −8.677437E−10 | −8.009019E−10 | 1.878436E−09 | −1.372181E−10 | −1.320127E−09 | 1.277954E−12 | |
| X4Y | −3.215827E−13 | 1.670802E−13 | −1.372762E−10 | 4.754789E−14 | −6.365774E−12 | −2.679463E−16 | |
| X2Y3 | −1.228117E−12 | 3.874349E−13 | −2.437182E−11 | −1.718101E−13 | −6.070058E−12 | −1.679816E−15 | |
| Y5 | −1.148542E−13 | 2.500543E−13 | 1.577671E−12 | 5.427575E−13 | −6.442309E−12 | −1.838497E−15 | |
| X6 | 0.000000E+00 | 0.000000E+00 | 0.000000E+00 | 0.000000E+00 | 0.000000E+00 | 0.000000E+00 | |
| X4Y2 | 0.000000E+00 | 0.000000E+00 | 0.000000E+00 | 0.000000E+00 | 0.000000E+00 | 0.000000E+00 | |
| X2Y4 | 0.000000E+00 | 0.000000E+00 | 0.000000E+00 | 0.000000E+00 | 0.000000E+00 | 0.000000E+00 | |
| Y6 | 0.000000E+00 | 0.000000E+00 | 0.000000E+00 | 0.000000E+00 | 0.000000E+00 | 0.000000E+00 | |
| X6Y | 0.000000E+00 | 0.000000E+00 | 0.000000E+00 | 0.000000E+00 | 0.000000E+00 | 0.000000E+00 | |
| X4Y3 | 0.000000E+00 | 0.000000E+00 | 0.000000E+00 | 0.000000E+00 | 0.000000E+00 | 0.000000E+00 | |
| X2Y5 | 0.000000E+00 | 0.000000E+00 | 0.000000E+00 | 0.000000E+00 | 0.000000E+00 | 0.000000E+00 | |
| Y7 | 0.000000E+00 | 0.000000E+00 | 0.000000E+00 | 0.000000E+00 | 0.000000E+00 | 0.000000E+00 | |
| X8 | 0.000000E+00 | 0.000000E+00 | 0.000000E+00 | 0.000000E+00 | 0.000000E+00 | 0.000000E+00 | |
| X6Y2 | 0.000000E+00 | 0.000000E+00 | 0.000000E+00 | 0.000000E+00 | 0.000000E+00 | 0.000000E+00 | |
| X4Y4 | 0.000000E+00 | 0.000000E+00 | 0.000000E+00 | 0.000000E+00 | 0.000000E+00 | 0.000000E+00 | |
| X2Y6 | 0.000000E+00 | 0.000000E+00 | 0.000000E+00 | 0.000000E+00 | 0.000000E+00 | 0.000000E+00 | |
| Y8 | 0.000000E+00 | 0.000000E+00 | 0.000000E+00 | 0.000000E+00 | 0.000000E+00 | 0.000000E+00 | |
| X8Y | 0.000000E+00 | 0.000000E+00 | 0.000000E+00 | 0.000000E+00 | 0.000000E+00 | 0.000000E+00 | |
| X6Y3 | 0.000000E+00 | 0.000000E+00 | 0.000000E+00 | 0.000000E+00 | 0.000000E+00 | 0.000000E+00 | |
| X4Y5 | 0.000000E+00 | 0.000000E+00 | 0.000000E+00 | 0.000000E+00 | 0.000000E+00 | 0.000000E+00 | |
| X2Y7 | 0.000000E+00 | 0.000000E+00 | 0.000000E+00 | 0.000000E+00 | 0.000000E+00 | 0.000000E+00 | |
| Y9 | 0.000000E+00 | 0.000000E+00 | 0.000000E+00 | 0.000000E+00 | 0.000000E+00 | 0.000000E+00 | |
| X10 | 0.000000E+00 | 0.000000E+00 | 0.000000E+00 | 0.000000E+00 | 0.000000E+00 | 0.000000E+00 | |
| X8Y2 | 0.000000E+00 | 0.000000E+00 | 0.000000E+00 | 0.000000E+00 | 0.000000E+00 | 0.000000E+00 | |
| X6Y4 | 0.000000E+00 | 0.000000E+00 | 0.000000E+00 | 0.000000E+00 | 0.000000E+00 | 0.000000E+00 | |
| X4Y6 | 0.000000E+00 | 0.000000E+00 | 0.000000E+00 | 0.000000E+00 | 0.000000E+00 | 0.000000E+00 | |
| X2Y8 | 0.000000E+00 | 0.000000E+00 | 0.000000E+00 | 0.000000E+00 | 0.000000E+00 | 0.000000E+00 | |
| Y10 | 0.000000E+00 | 0.000000E+00 | 0.000000E+00 | 0.000000E+00 | 0.000000E+00 | 0.000000E+00 | |
| Nradius | 1.000000E+00 | 0.000000E+00 | 1.000000E+00 | 1.000000E+00 | 1.000000E+00 | 1.000000E+00 | |
| Y-decentre | 172.287 | 276.185 | 336.270 | 167.562 | 379.550 | 267.210 | 0.000 |
| X-rotation | −3.535 | −5.840 | 10.868 | 13.825 | 9.306 | 4.657 | 0.000 |

The imaging beam path between the intermediate image plane 19 and the image field 8, in the projection optical system 7 according to FIG. 4, corresponds to that of the projection optical system 7 according to FIG. 3.

The object field 4 and the mirror M5 are arranged on different sides of the main plane 23.

The mirrors M1 and M4 on the one hand, and the mirrors M3 and M6, on the other hand, in the projection optical system 7 according to FIG. 4, are arranged back to back.

The mirrors M1, M3 and M6 are concave. The mirror M5 is convex. The mirrors M2 and M4 have a radius of curvature which is so great that they appear virtually to be a planar mirror in FIG. 4.

In the projection optical system 7 according to FIG. 4, an aperture diaphragm may be arranged in the region of the pupil plane 17 between the mirrors M2 and M3.

The central pupil obscuration, in the projection optical system 7 according to FIG. 4, is 4.0%. The working spacing $d_w$ between the image plane 9 and the portion of the used reflection face of the mirror M5 closest to the image plane is 85 mm in the projection optical system according to FIG. 4. A ratio of this working spacing $d_w$ to the overall length of the projection optical system 7 according to FIG. 4 is 4.25%. The angle of incidence of the individual beams 15 on the mirror M5 in the meridional plane, which is shown in FIG. 4, is a maximum of 15.9°.

In the following table, characteristics of the projection optical system (PO) according to FIGS. 2, 3 and 4 are summarised again:

|  | PO according to FIG. 2 | PO according to FIG. 3 | PO according to FIG. 4 |
| --- | --- | --- | --- |
| NA | 0.5 | 0.5 | 0.5 |
| Image field size y times x [mm × mm] | 2 × 26 | 2 × 26 | 2 × 26 |
| Reduction scale | 4× | 4× | 4× |
| Pupil obscuration (exit pupil) [%] | 4.4 | 4.0 | 4.0 |
| Overall length [mm] | 1726 | 2300 | 2000 |
| max. angle of incidence of the central main beam [°] | 28.8 | 10.2 | 11.5 |
| max. angle of incidence in the meridional section | 34.5 | 16.9 | 15.9 |
| Main beam angle in the reticle for central field point [°] | 8 | 8 | 8 |
| Spacing of the centre of the mirror M5 from the image plane [mm] | 22 | 85 | 85 |

The main beam is the main beam 16 of a central point of the object field 4. This central point is defined as the point which is located in the centre between the two edge object field points in the meridional section.

Figure 5:
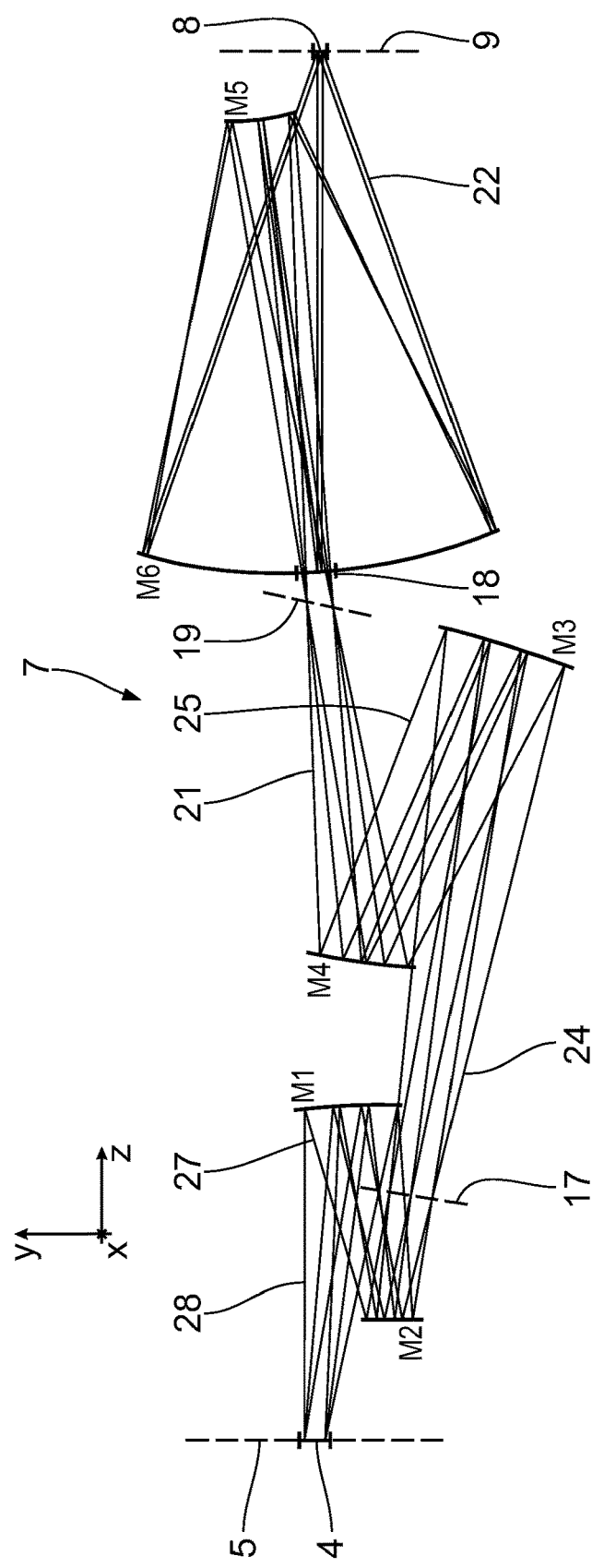

FIG. 5 shows a further embodiment of the projection optical system 7. Components, which correspond to those which have already been described above with reference to the projection optical system 7 from FIGS. 2 to 4 have the same reference numerals and are not discussed again in detail.

The imaging beam path between the object field 4 and the image field 8 in the projection optical system 7 according to FIG. 5 is reminiscent of the imaging beam path of the embodiment according to FIG. 4. In comparison to the imaging beam path of the configuration according to FIG. 4, that according to FIG. 5 with regard to the guidance of the imaging beams between the object field 4 and the mirror M4, appears mirrored about a plane lying virtually parallel to the xz-plane. In the imaging beam path of the projection optical system 7 according to FIG. 5, a part of the imaging beam path adjacent to the mirror M3 lies on the same side of the imaging beam path section 21 as the imaging light bundle 22 in the region of the image field 8. In the embodiment according to FIG. 5, a pupil plane 17 lies in the imaging beam path between the mirrors M2 and M3 and an intermediate image plane 19 lies between the mirrors M4 and M5.

The projection optical system 7 according to FIG. 5 has a numerical aperture NA on the image side of 0.33. The image field 8 has an extent of 26 mm in the x-direction and of 2.5 mm in the y-direction. The image field 8 is rectangular. A wave front error of the projection optical system 7 according to FIG. 5 is in the region between 0.2 and 0.5λ (rms, Root Mean Square). This wave front error is given for a wavelength λ, of 13.5 nm.

Figure 6:
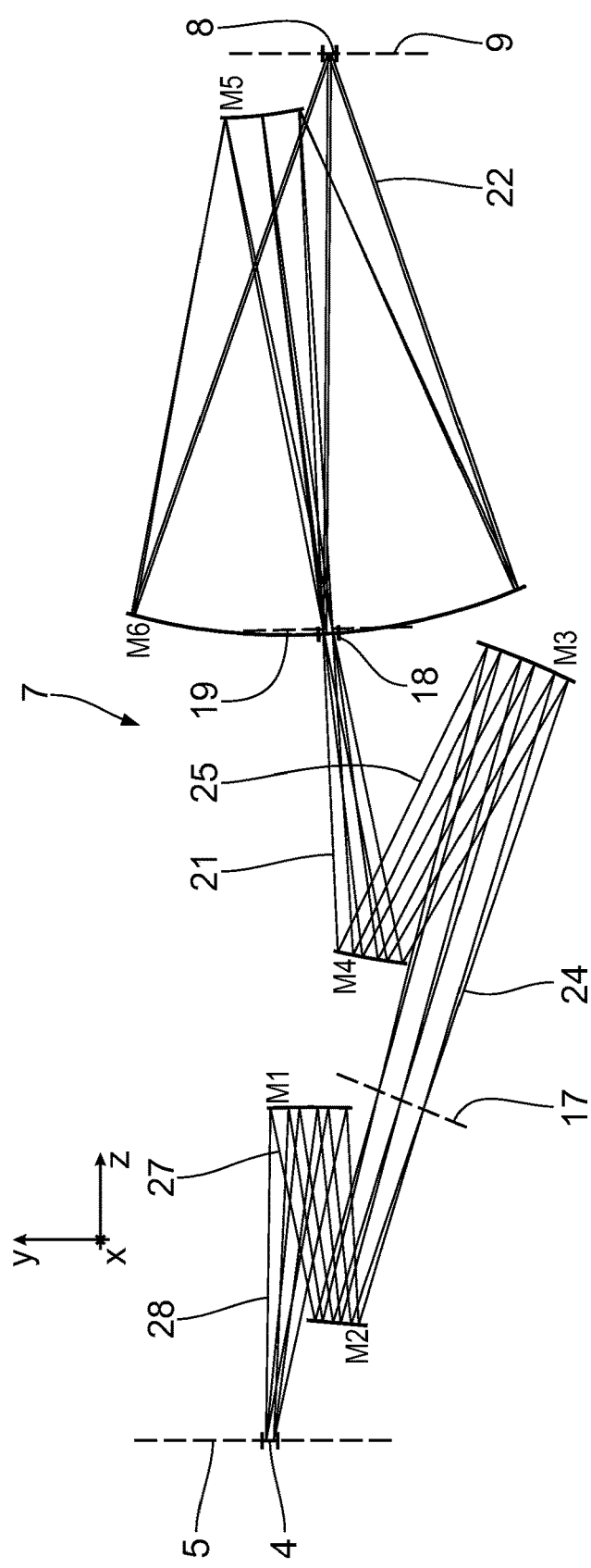

FIG. 6 shows a further embodiment of the projection optical system 7. Components which correspond to those which have already been described above with reference to the projection optical system 7 from FIGS. 2 to 5 have the same reference numerals and will not be discussed again in detail.

The imaging beam path between the object field 4 and the image field 8 in the projection optical system 7 according to FIG. 6 is comparable to the imaging beams path in the embodiment according to FIG. 5. The numerical aperture on the image side and the image field size and the image field form correspond to that which was described above in conjunction with the embodiment according to FIG. 5.

The projection optical system 7 according to FIG. 6 has a numerical aperture NA on the image side of 0.33. The image field 8 has an extent of 26 mm in the x-direction and 2.5 mm in the y-direction. The image field 8 is rectangular.

The projection optical system 7 according to FIG. 6 has an overall length of 1180 mm between the object plane 5 and the image plane 9.

The pupil plane 17 in the imaging beam path between the mirrors M2 and M3 is accessible from all sides in the embodiment according to FIG. 6.

A maximum angle of incidence on the mirror M4 may be 21° in the embodiment according to FIG. 6. The angle of incidence is a maximum angle of incidence here on the mirror M4 in the plane of the drawing of FIG. 6.

Figure 7:
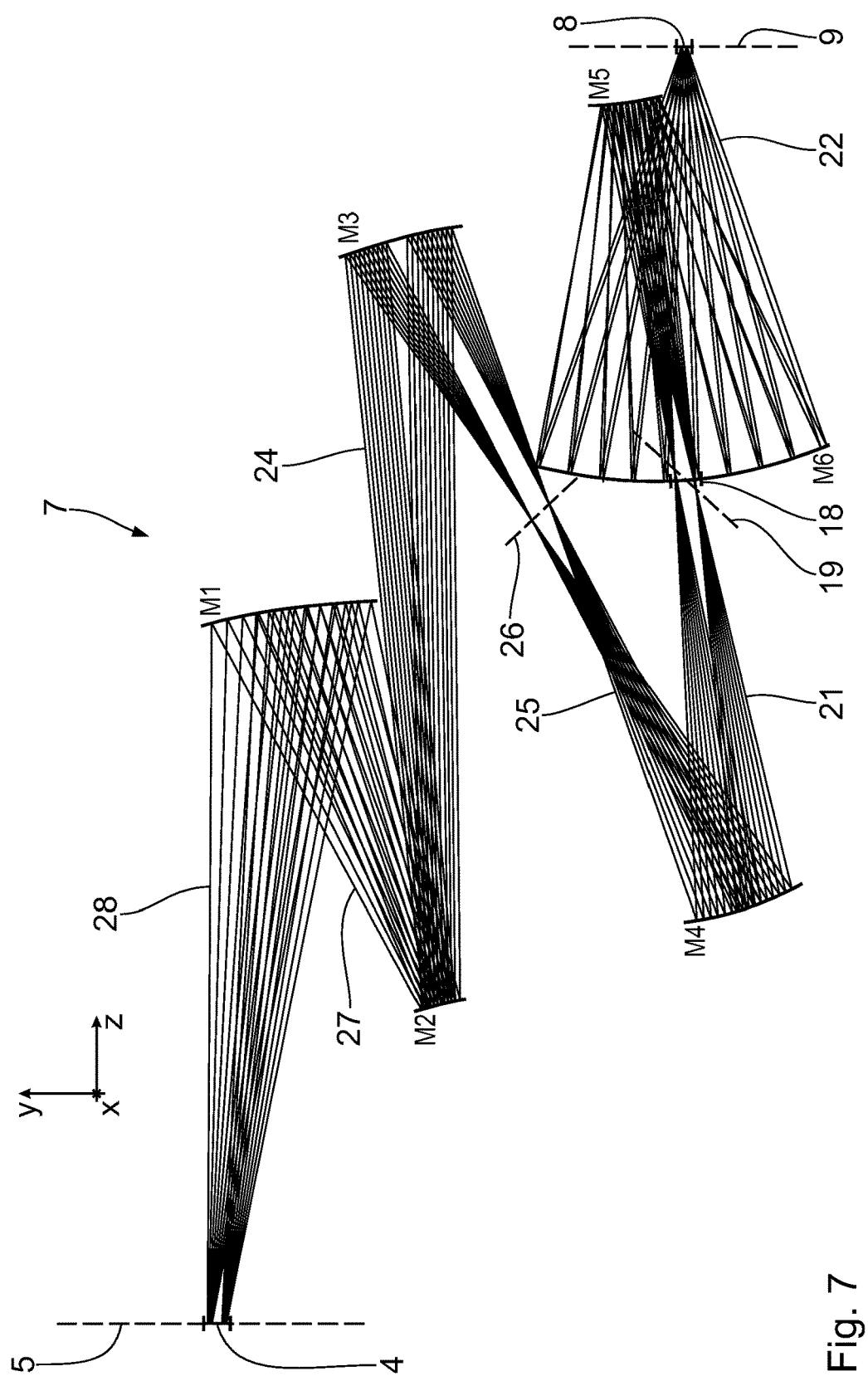

FIG. 7 shows a further embodiment of the projection optical system 7. Components which correspond to those which have already been described above with reference to the projection optical system 7 from FIGS. 2 to 6 have the same reference numerals and will not be discussed again in detail.

In the projection optical system 7 according to FIG. 7, the imaging beam path between the object field 4 and the mirror M4 in total runs on the side of the imaging beam path section 21 opposing the imaging light bundle 22 between the mirrors M4 and M5.

In the imaging beam path of the embodiment according to FIG. 7, no overall intersecting imaging beam path sections are present between the object field 4 and the mirror M4. The fact that individual beams of the imaging beam path sections intersect in the reflection path during the reflection on the mirrors M1 to M4 does not represent intersecting imaging beam path sections overall of the imaging beam path.

An imaging beam path section 25 extending between the mirrors M3 and M4 is guided past the mirror M6 in the embodiment according to FIG. 7. A further intermediate image plane 26 in the imaging beam path section 25 lies in the region of this guiding past. The projection optical system 7 according to FIG. 7 thus has, in addition to the intermediate image plane 19, which lies close to the through-opening 18 in the imaging beam path, the further intermediate image plane 26. Thus, two intermediate images are present in the imaging beam path between the object field 4 and the image field 8 in the projection optical system 7 according to FIG. 7.

Figure 8:
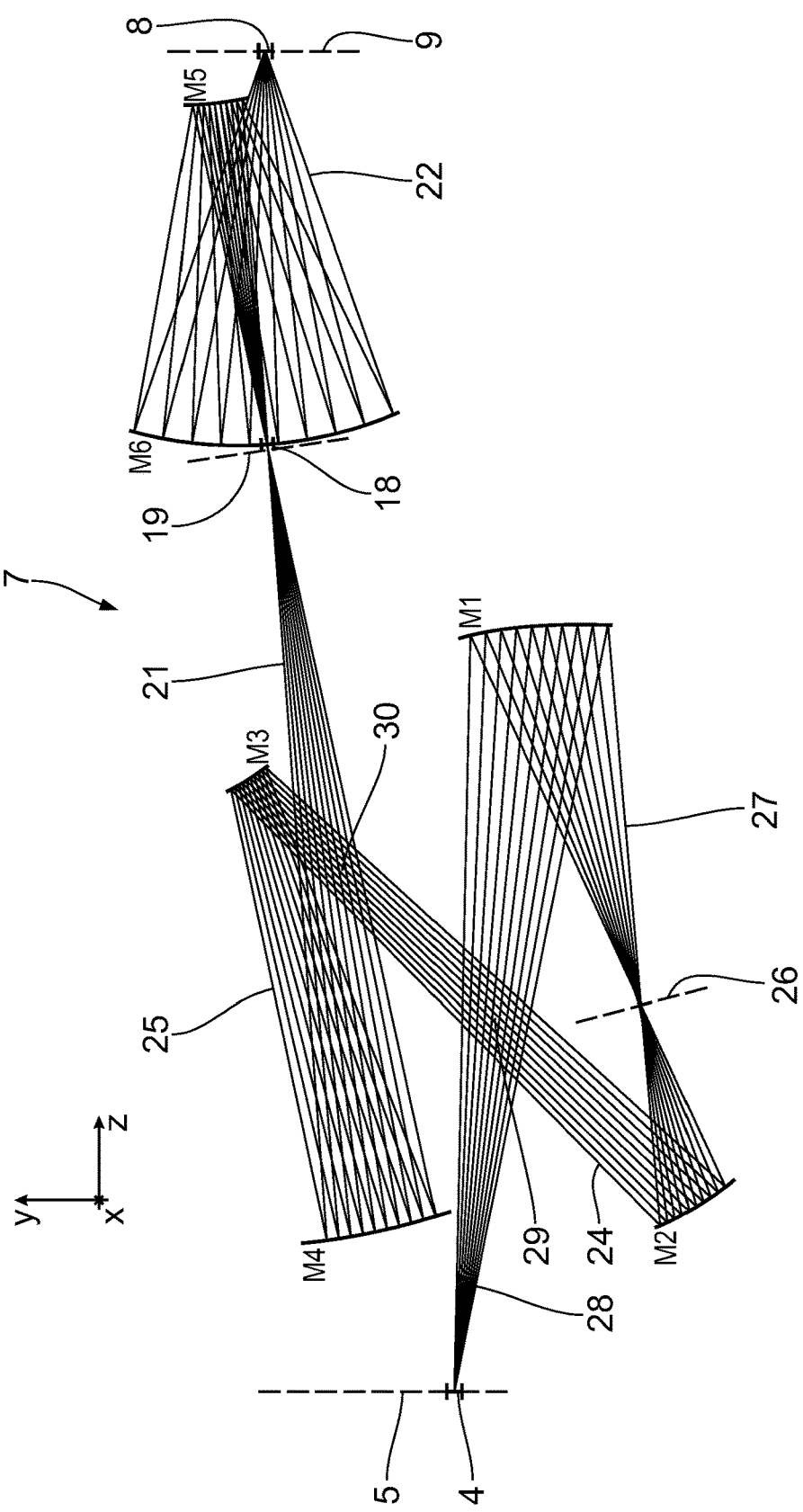

FIG. 8 shows a further embodiment of the projection optical system 7. Components which correspond to those which have already been described above with reference to the projection optical system 7 from FIGS. 2 to 7 have the same reference numerals and will not be discussed again in detail.

In the projection optical system 7 according to FIG. 8, a portion of the imaging beam path associated with the reflection on the mirror M3 is guided on the side of the imaging beam path section 21 opposing the imaging light bundle 22.

An intermediate image plane 26 lies in an imaging beam path section 27 between the mirrors M1 and M2. The second intermediate image plane 19 is arranged, as in the above-described embodiments, in the region of the through-opening 18.

In the imaging beam path of the embodiment according to FIG. 8, the imaging beam path section 24 between the mirrors M2 and M3, intersects an imaging beam path section 28 between the object field 4 and the mirror M1 in a first intersection region 29. The imaging beam path section 21 between the mirror M4 and M5 in turn intersects the imaging beam path section 24 between the mirrors M2 and M3 in a further intersection region 30.

The projection optical systems according to FIGS. 8 to 17 may have a numerical aperture NA of 0.33. An image field size of these projection optical systems may be 2.5 mm in the x-direction and 26 mm in the y-direction.

Figure 9:
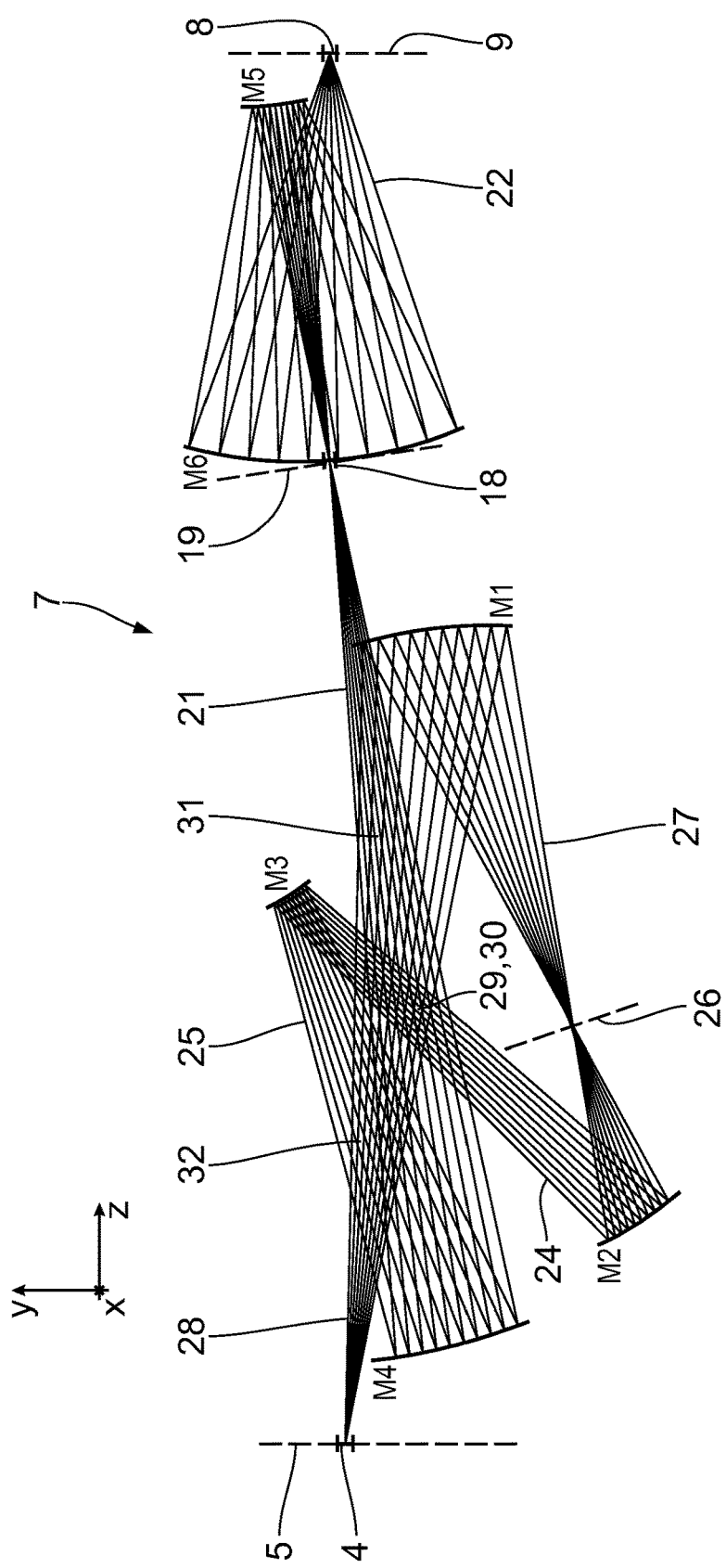

FIG. 9 shows a further embodiment of the projection optical system 7. Components which correspond to those which were already described above with reference to the projection optical system 7 from FIGS. 2 to 8 have the same reference numerals and will not be discussed again in detail.

The imaging beam path in the embodiment of the projection optical system 7 according to FIG. 9 substantially corresponds to the imaging beam path of the embodiment according to FIG. 8. A difference lies in the guidance of the imaging beam path section 28: this imaging beam path section 28 between the object field 4 and the mirror M1, in the embodiment according to FIG. 9, does not only intersect the imaging beam path section 24 between the mirrors M2 and M3, but also the imaging beam path section 25 between the mirrors M3 and M4 and the imaging beam path section 21 between the mirrors M4 and M5. An intersection region 31 of the intersection last mentioned between the imaging beam path section 28 and the imaging beam path section 21 in portions overlaps with the intersection regions 29 and 30. In the imaging beam path of the embodiment according to FIG. 9, the intersection regions 29 and 30 also overlap one another.

An intersection region 32 of the intersection between the imaging beam path sections 28 and 25 is separated from the intersection regions 29 and 30 and partially overlaps with the intersection or crossing region 31.

Figure 10:
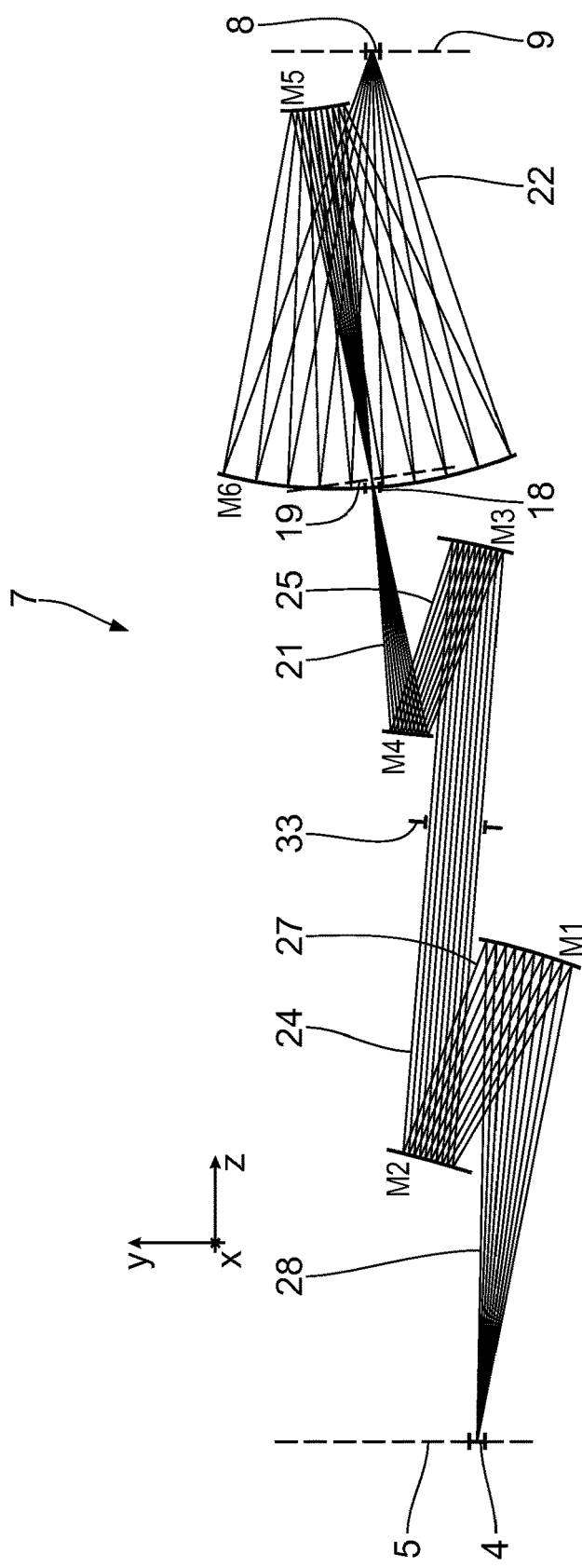

FIG. 10 shows a further embodiment of the projection optical system 7. Components which have already been described above with reference to the projection optical system 7 from FIGS. 2 to 9, have the same reference numerals and will not be described in detail again.

An imaging beam path of the embodiment of the projection optical system 7 according to FIG. 10, apart from an arrangement mirrored about an xz-plane, is similar to the imaging beam path of the embodiment according to FIG. 2. In contrast to the imaging beam path according to FIG. 2, in the embodiment according to FIG. 10, the mirror M3 is located closer to the mirror M6 than the mirror M1. In the embodiment of the projection optical system 7 according to FIG. 2, the situation is precisely vice versa: there, the mirror M1 is closer to the mirror M6 than the mirror M3. In addition, in the embodiment of the projection optical system 7 according to FIG. 10, the mirror M2 is located significantly closer to the object plane 5 than the mirror M4.

In the imaging beam path section 24 between the mirrors M2 and M3, in the embodiment according to FIG. 10, a diaphragm or stop 33 may be arranged in the region of a pupil plane of the projection optical system 7 according to FIG. 10. The imaging beam path section 24 is freely accessible from all sides in the region of this arrangement of the diaphragm 33.

Figure 11:
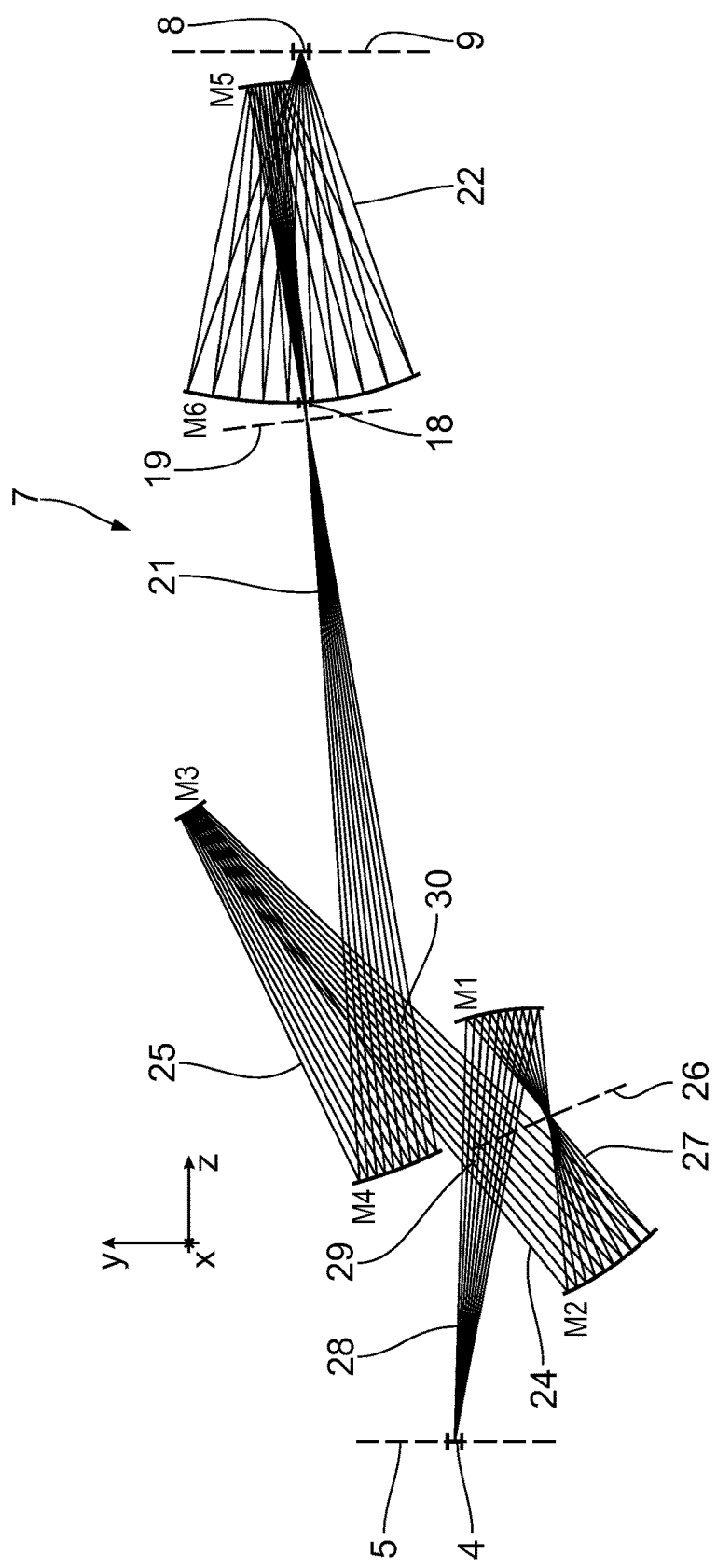

FIG. 11 shows a further embodiment of the projection optical system 7. Components which correspond to those which have already been described above with reference to the projection optical system 7 from FIGS. 2 to 10 have the same reference numerals and are not discussed again in detail.

The imaging beam path in the embodiment of the projection optical system 7 according to FIG. 11 corresponds to the imaging beam path of the embodiment according to FIG. 8. In the projection optical systems according to FIGS. 11 to 14, mirrors M1 to M6 may be used that have different radii of curvature in two directions that are orthogonal to one another, in other words, on the one hand, in the xz-plane and, on the other hand, in the yz-plane.

The projection optical system 7 according to FIG. 11 is telecentric on the object side.

Figure 12:
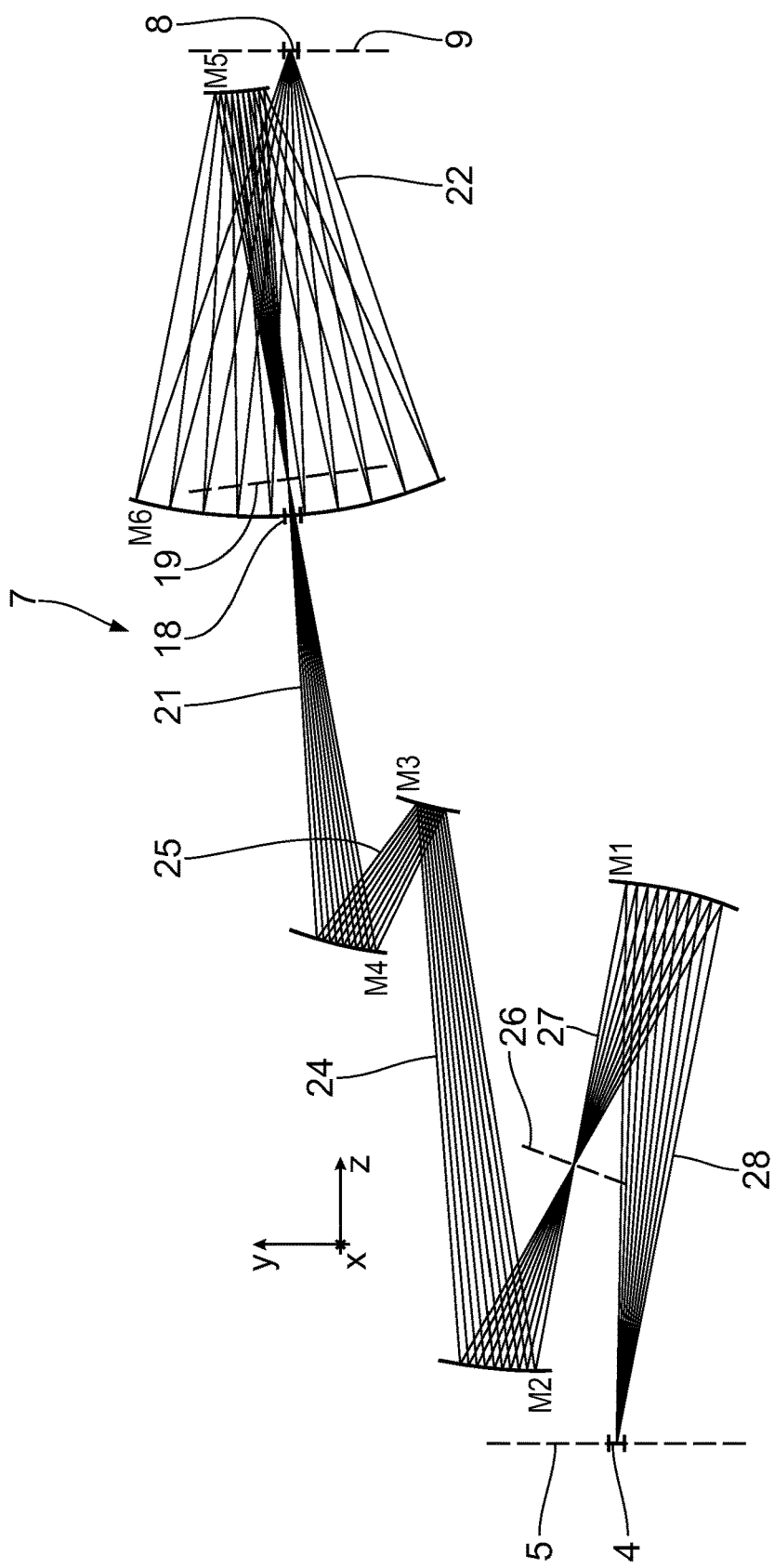

FIG. 12 shows a further embodiment of the projection optical system 7. Components which correspond to those which have already been described with reference to the projection optical system 7 from FIGS. 2 to 11 have the same reference numerals and will not be discussed again in detail.

The imaging beam path in the embodiment of the projection optical system 7 according to FIG. 12 is similar to that of the embodiment according to FIG. 2, apart from a view which is mirror-inverted about an xz-plane. In contrast to the embodiment according to FIG. 2, in the embodiment of the projection optical system 7 according to FIG. 12, in the imaging beam path section 27 between the mirrors M1 and M2, there is an intermediate image in an intermediate image plane 26 in addition to the further intermediate image in the intermediate image plane 19, which is located adjacent to the through-opening 18. In the embodiment of the projection optical system 7 according to FIG. 12, the mirror M3 is located closer to the mirror M6 than the mirror M1. This also distinguishes the imaging beam path of the projection optical system 7 according to FIG. 12 from that of the embodiment according to FIG. 2, where the mirror M1 is closer to the mirror M6 than the mirror M3.

The projection optical system 7 according to FIG. 12 is telecentric on the object side.

Figure 13:
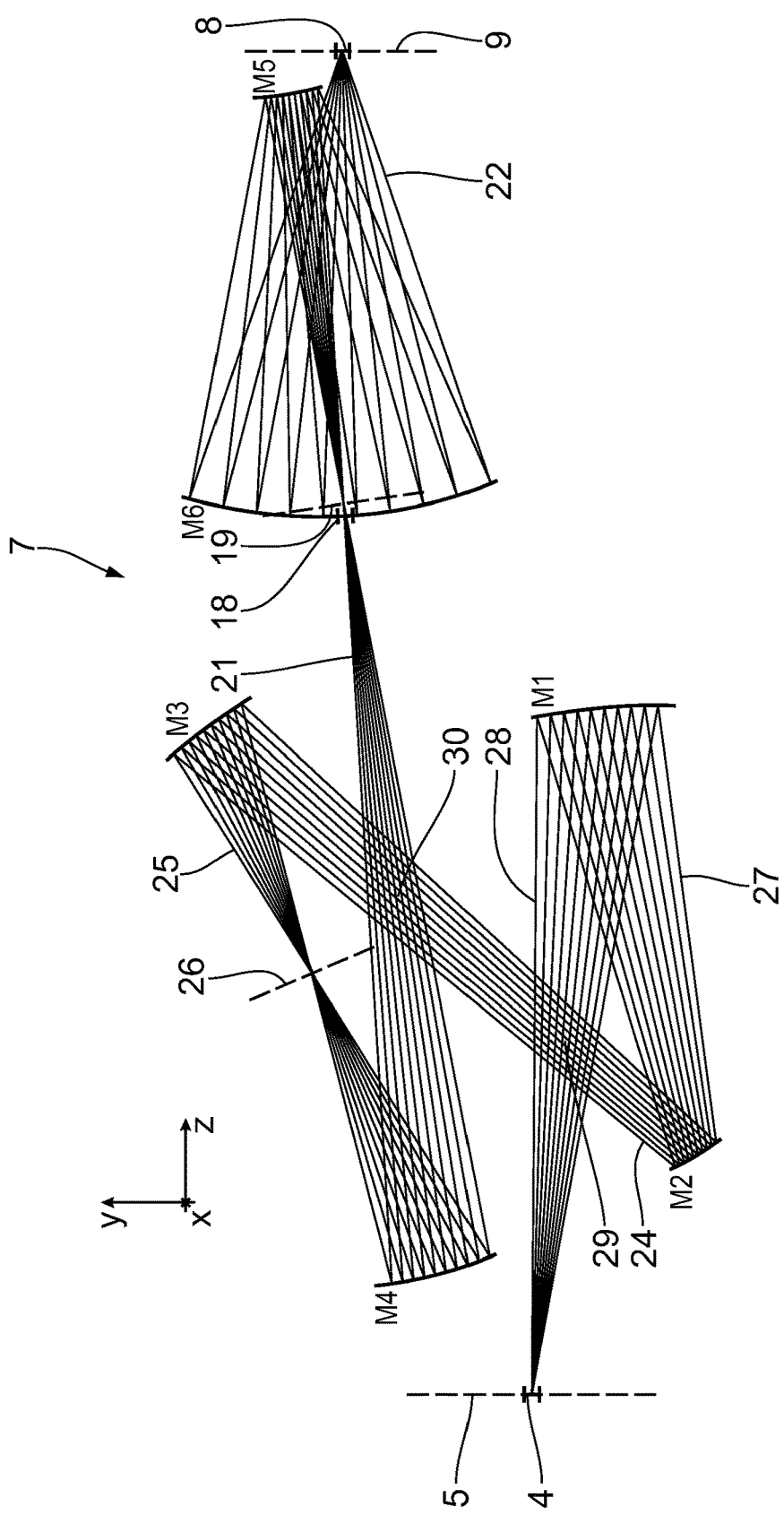

FIG. 13 shows a further embodiment of the projection optical system 7. Components which correspond to those which have already been described above with reference to the projection optical system 7 from FIGS. 2 to 12 have the same reference numerals and are not discussed again in detail.

The imaging beam path, in the embodiment of the projection optical system 7 according to FIG. 12, is similar to the imaging beam path of the embodiment according to FIG. 8. In contrast to the embodiment according to FIG. 8, in the imaging beam path of the projection optical system 7 according to FIG. 13, in the imaging beam path section 25 between the mirrors M3 and M4, there is an intermediate image in an intermediate image plane 26, in addition to the intermediate image plane 19, which is located in the region of the through-opening 18.

The projection optical system 7 according to FIG. 13 is telecentric on the object side.

Figure 14:
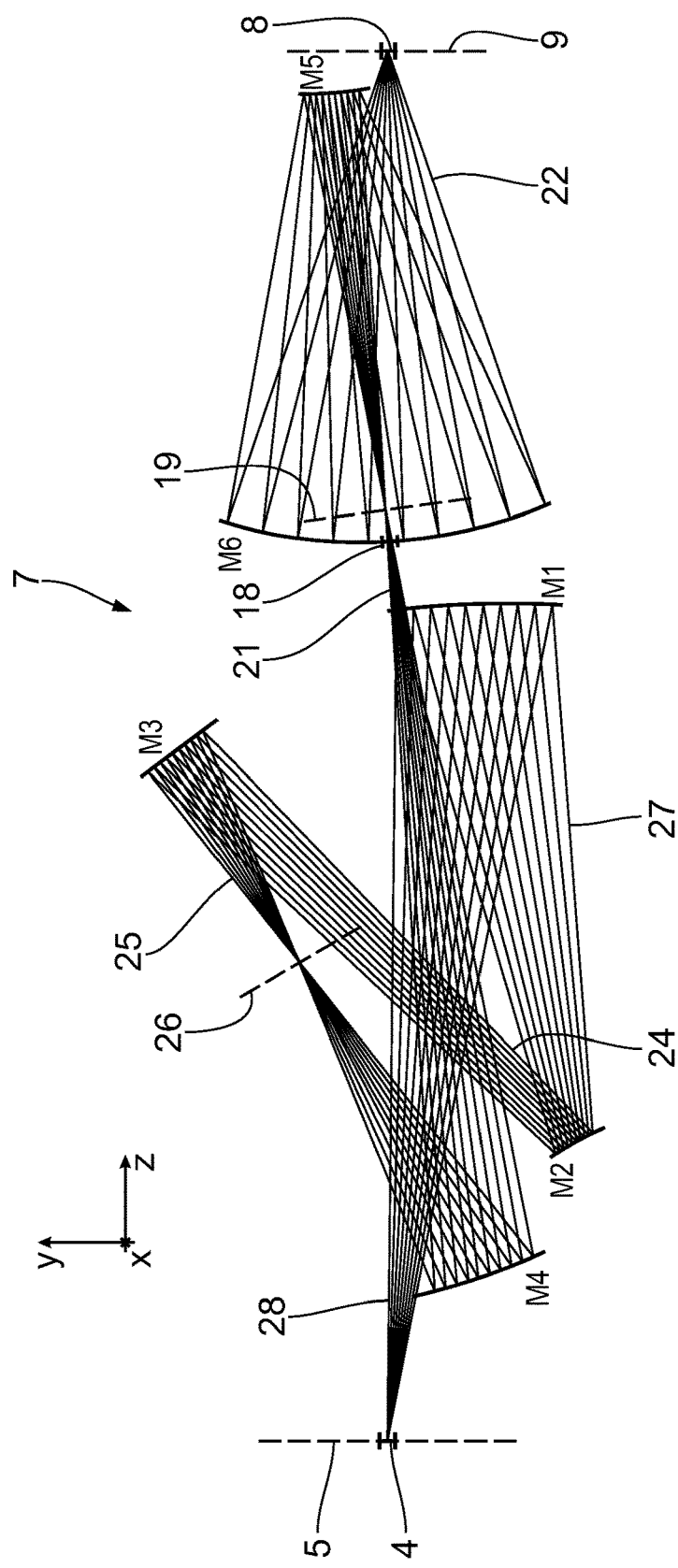

FIG. 14 shows a further embodiment of the projection optical system 7. Components which correspond to those which have already been described above with reference to the projection optical system 7 from FIGS. 2 to 13 have the same reference numerals and are not discussed again in detail.

The imaging beam path in the embodiment of the projection optical system 7 according to FIG. 14 is similar to the imaging beam path of the embodiment according to FIG. 9. In contrast to the embodiment according to FIG. 9, an intermediate image is present in the imaging beam path of the projection optical system 7 according to FIG. 14, in the imaging beam path section 25 between the mirrors M3 and M4 and not between the mirrors M1 and M2, in an intermediate image plane 26 in addition to the intermediate image plane 19, which is located in the region of the through-opening 18.

Figure 15:
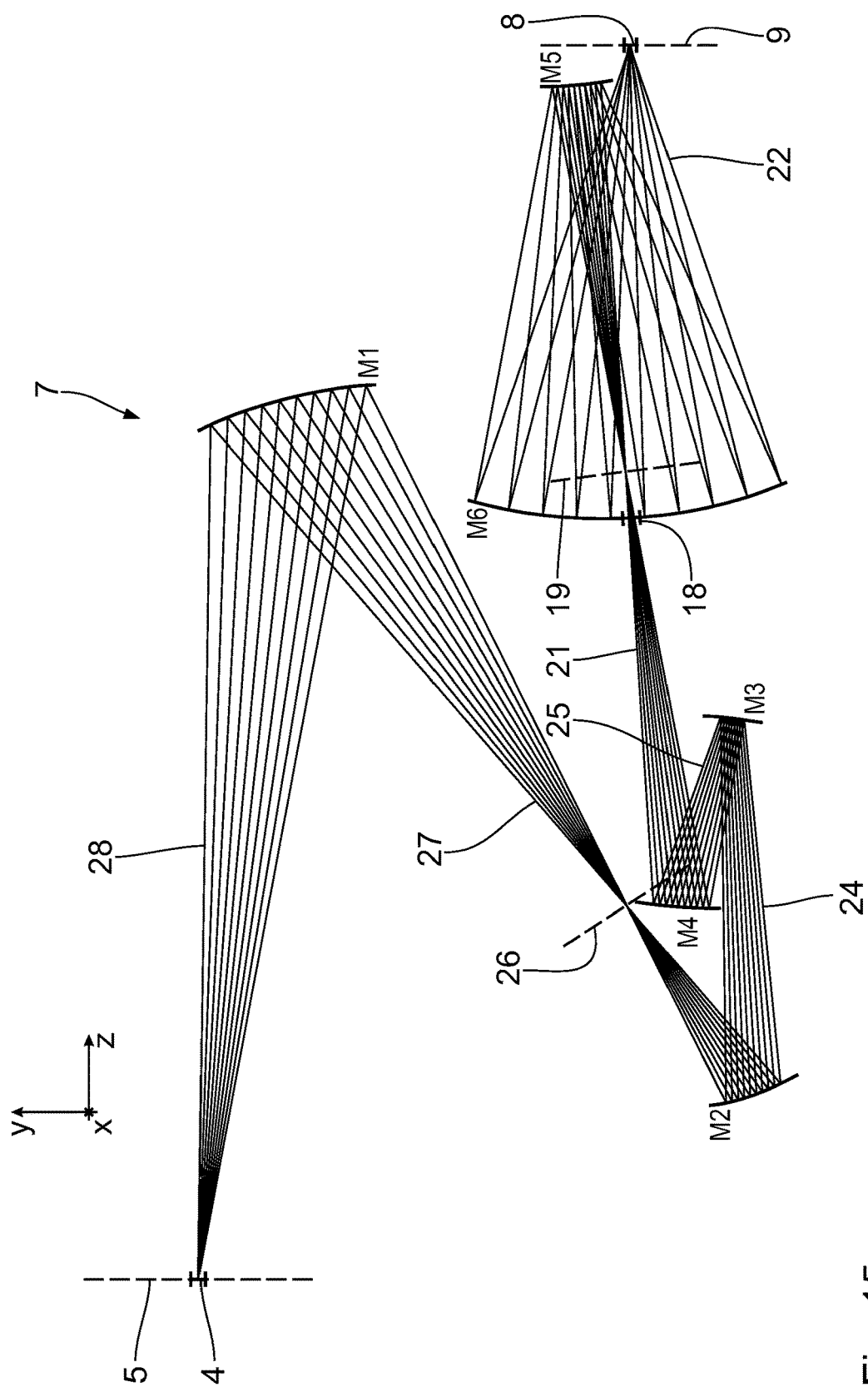

FIG. 15 shows a further embodiment of the projection optical system 7. Components which correspond to those which have already been described above with reference to the projection optical system 7 from FIGS. 2 to 14 have the same reference numerals and will not be discussed again in detail.

The imaging beam path of the projection optical system 7 according to FIG. 15, between the mirror M2 and the image field 8, is similar to the imaging beam path of the embodiment according to FIG. 5.

The imaging beam path section 27 between the mirrors M1 and M2, in the embodiment of the projection optical system 7 according to 15, is guided past both the mirror M6 and the mirror M4. Arranged adjacent to the mirror M4 in the imaging beam path section 27 is an intermediate image in an intermediate image plane 26 in addition to the intermediate image in the intermediate image plane 19, which is located close to the through-opening 18.

Figure 16:
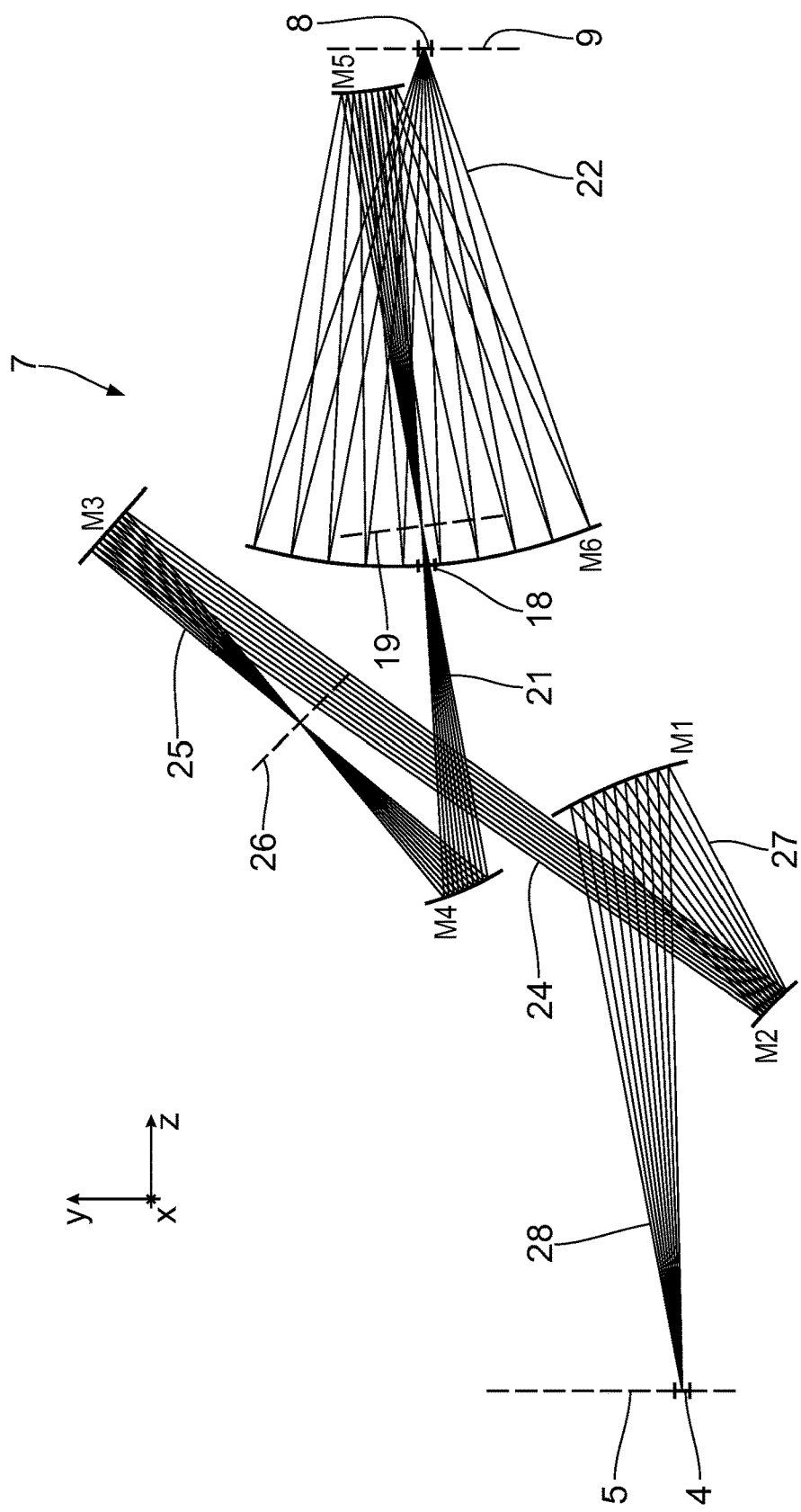

FIG. 16 shows a further embodiment of the projection optical system 7. Components which correspond to those which have already been described above with reference to the projection optical system 7 from FIGS. 2 to 15 have the same reference numerals and will not be discussed again in detail.

The imaging beam path of the projection optical system 7 according to FIG. 16 is similar to the imaging beam path according to FIG. 13. In contrast to the imaging beam path of the embodiment according to FIG. 13, in the projection optical system 7 according to FIG. 16, the imaging beam path section 24 between the mirrors M2 and M3 is guided past the mirror M6. In the embodiment according to FIG. 13, the mirrors M3 and M6 are arranged back to back.

Figure 17:
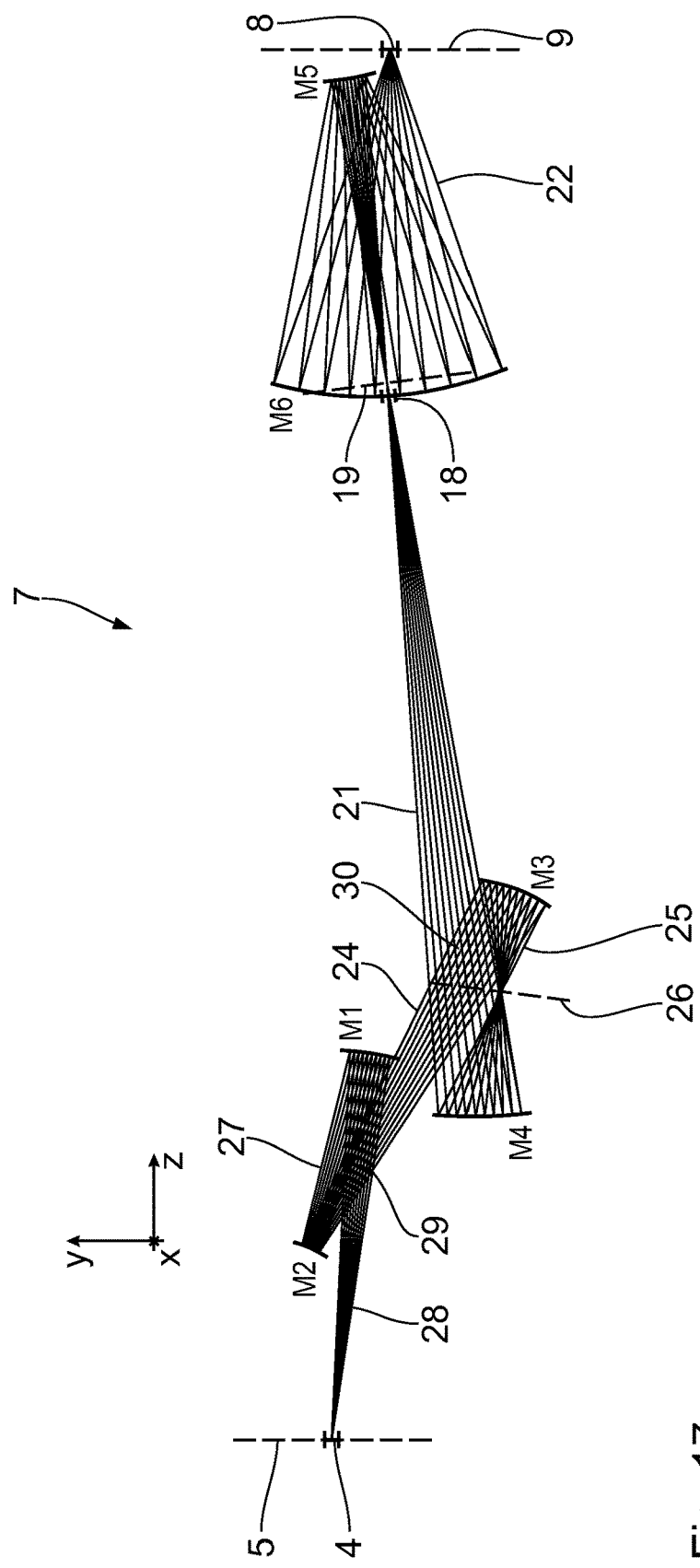

FIG. 17 shows a further embodiment of the projection optical system 7. Components which correspond to those which have already been described above with reference to the projection optical system 7 from FIGS. 2 to 16 have the same reference numerals and will not be discussed again in detail.

The imaging beam path of the projection optical system 7 according to FIG. 17, from the mirror M3, is similar to the imaging beam path of the embodiment according to FIG. 13. In contrast to this, the imaging beam path section 28 between the object field 4 and the mirror M1 intersects the imaging beam path section 24 between the mirrors M2 and M3. A further difference between the embodiments according to FIGS. 17 and 3 is that in the embodiment according to FIG. 17 in the imaging beam path section 25 between the mirrors M3 and M4, an intermediate image is arranged in an intermediate image plane 26. This intermediate image is present in turn in addition to the intermediate image in the intermediate image plane 19 close to the through-opening 18.

Figure 18:
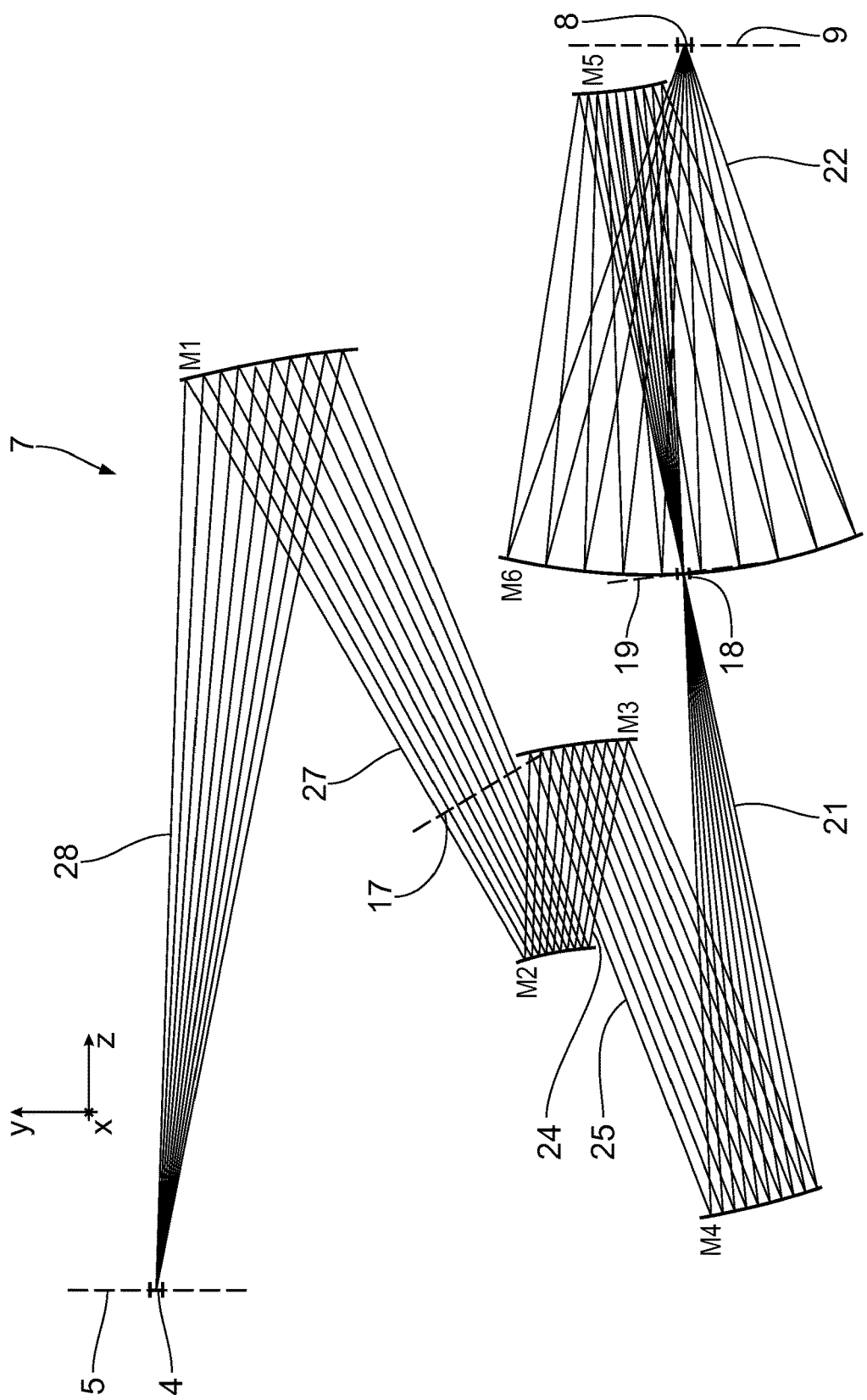

FIG. 18 shows a further embodiment of the projection optical system 7. Components which correspond to those which have already been described above with reference to the projection optical system 7 from FIGS. 2 to 17 have the same reference numerals and will not be discussed again in detail.

The imaging beam path in the embodiment according to FIG. 18 between the object field 4 and the mirror M4 is guided in total on a side of the imaging beam path section 21 opposing the imaging light bundle 22 between the mirrors M4 and M5. The imaging beam path of the embodiment according to FIG. 18 differs in this regard from that of the embodiment of FIG. 2. The course of the imaging beam path between the object field 4 and the mirror M4 is otherwise reminiscent of the course of the imaging beam path in the projection optical system 7 according to FIG. 2. A further difference is that in the embodiment according to FIG. 18, a pupil plane 17 is arranged in the imaging beam path section 27 between the mirrors M1 and M2. Between these two mirrors, the imaging beam path section 27 is accessible in broad regions from all sides.

The projection optical system 7 according to FIG. 18 has a numerical aperture NA on the image side of 0.33. The image field has an extent of 26 mm in the x-direction and of 2.5 mm in the y-direction. The image field 8 is rectangular.

The projection optical system 7 according to FIG. 18 has a wave front error in the range between 0.03 and 0.10λ (rms) over the image field 8.

The mirrors M1 to M6 are designed as free-form faces of the tenth order.

The mirror M6 has a diameter of 460 mm. The projection optical system 7 according to FIG. 18 has an overall length of 1630 mm between the object plane 5 and the image plane 9.

The maximum angle of incidence on one of the mirrors M1 to M6 may be 17°. The angle of incidence here is a maximum angle of incidence in the drawing plane of FIG. 18.

The imaging beam path section 27 is guided past the mirror M6. The mirrors M3 and M6 are arranged back to back.

Figure 19:
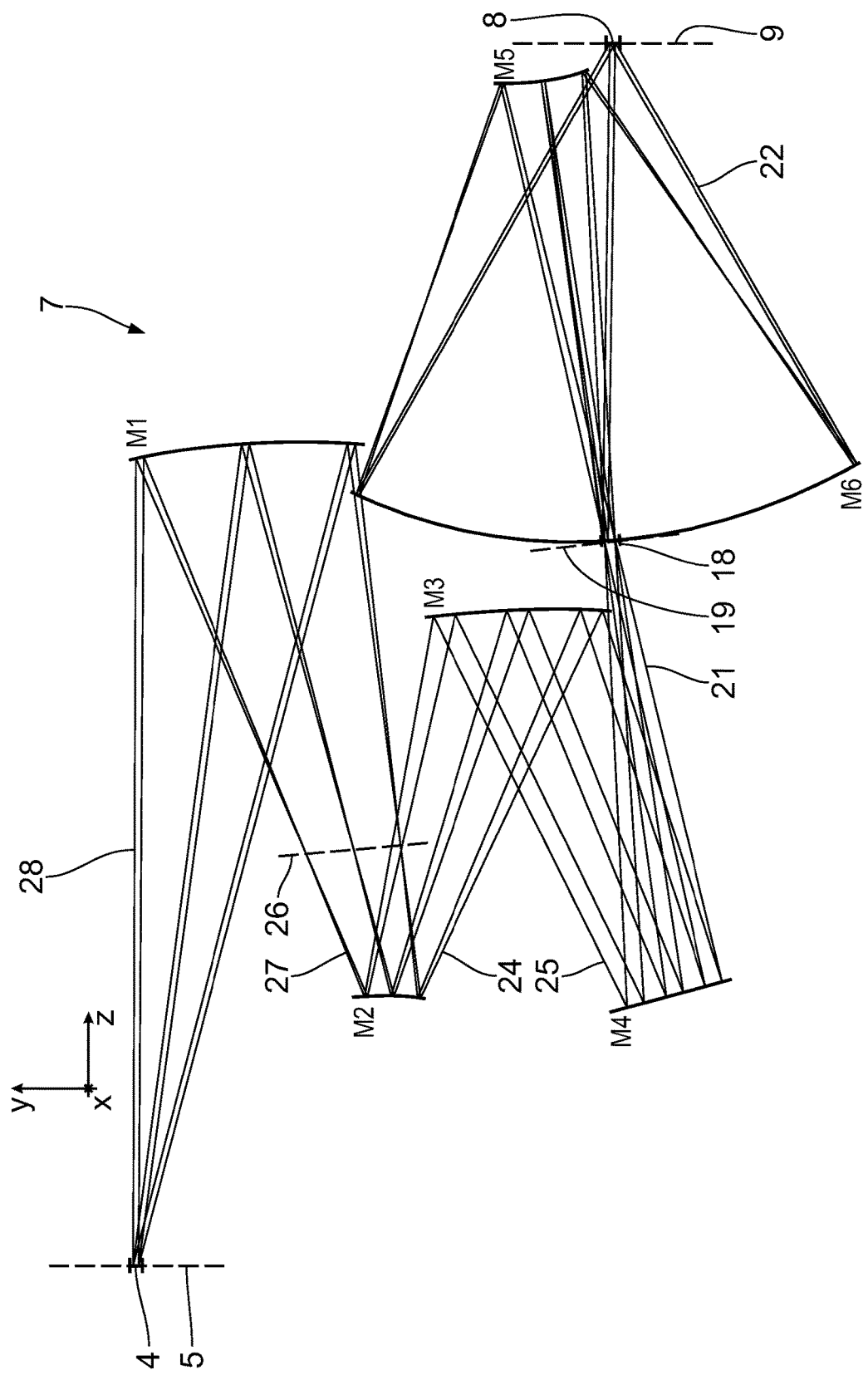

FIG. 19 shows a further embodiment of the projection optical system 7. Components which correspond to those which have already been described above with reference to the projection optical system 7 from FIGS. 2 to 18 have the same reference numeral and will not be discussed again in detail.

The imaging beam path in the embodiment of the projection optical system 7 according to FIG. 19 is similar to that of the embodiment according to FIG. 18.

The projection optical system 7 according to FIG. 19 has a numerical aperture NA on the image side of 0.50. The image field has an extent of 26 mm in the x-direction and of 2.5 mm in the y-direction. The image field 8 is rectangular.

The wave front error in the embodiment according to FIG. 19 is a maximum of $0.25\lambda$ (rms) over the image field 8.

The mirrors M1 to M6 are designed as free-form faces of the tenth order.

The mirror M6 in the embodiment according to FIG. 19 has a diameter of 700 mm. The overall length of the projection optical system 7 according to FIG. 19 between the object plane 5 and the image plane 9 is 1800 mm.

Figure 20:
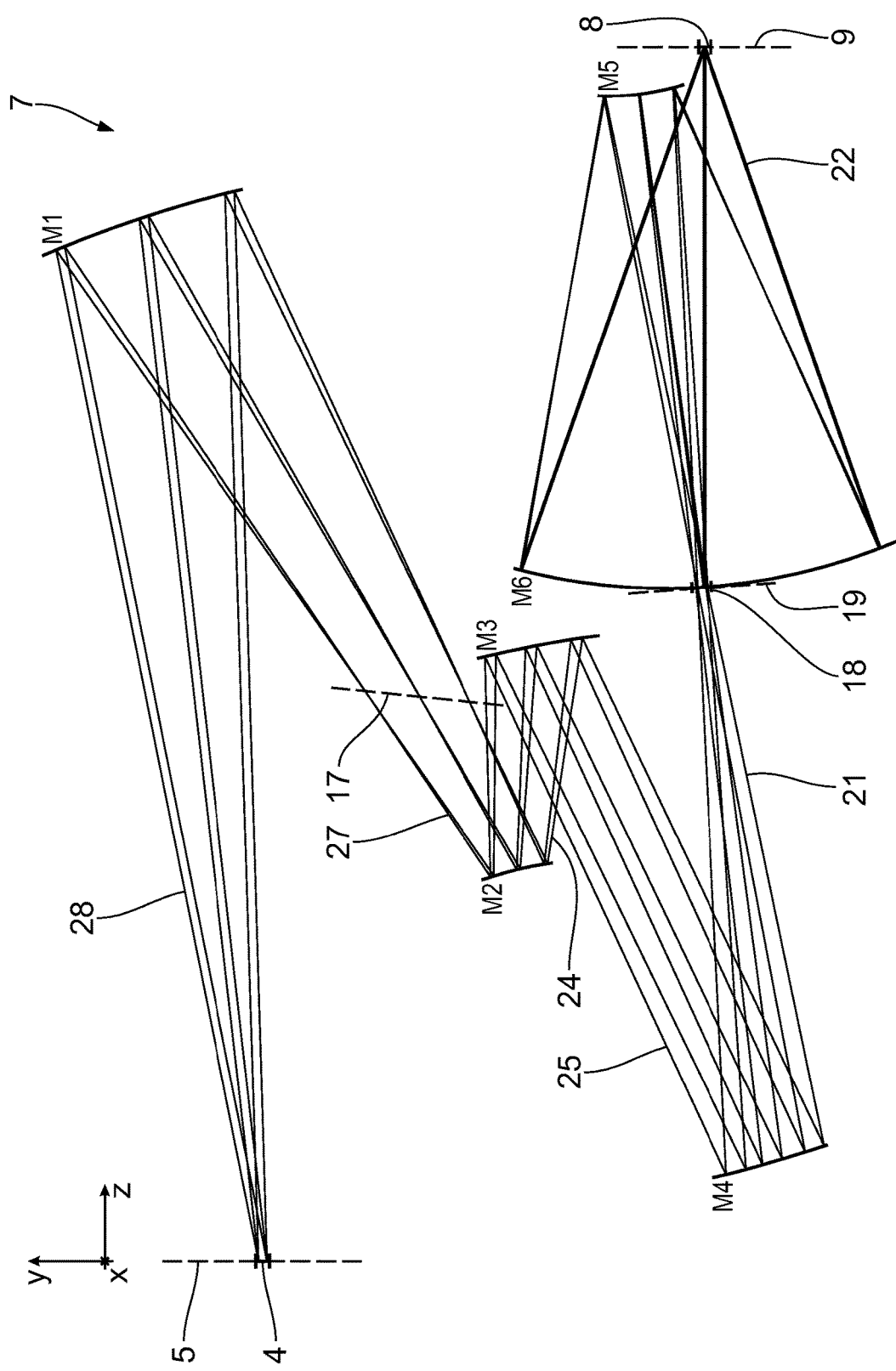

FIG. 20 shows a further embodiment of the projection optical system 7. Components which correspond to those which have already been described above with reference to the projection optical system 7 from FIGS. 2 to 19 have the same reference numerals and will not be discussed again in detail.

The imaging beam path of the projection optical system 7 according to FIG. 20 corresponds to that of the embodiment according to FIG. 18.

Figure 21:
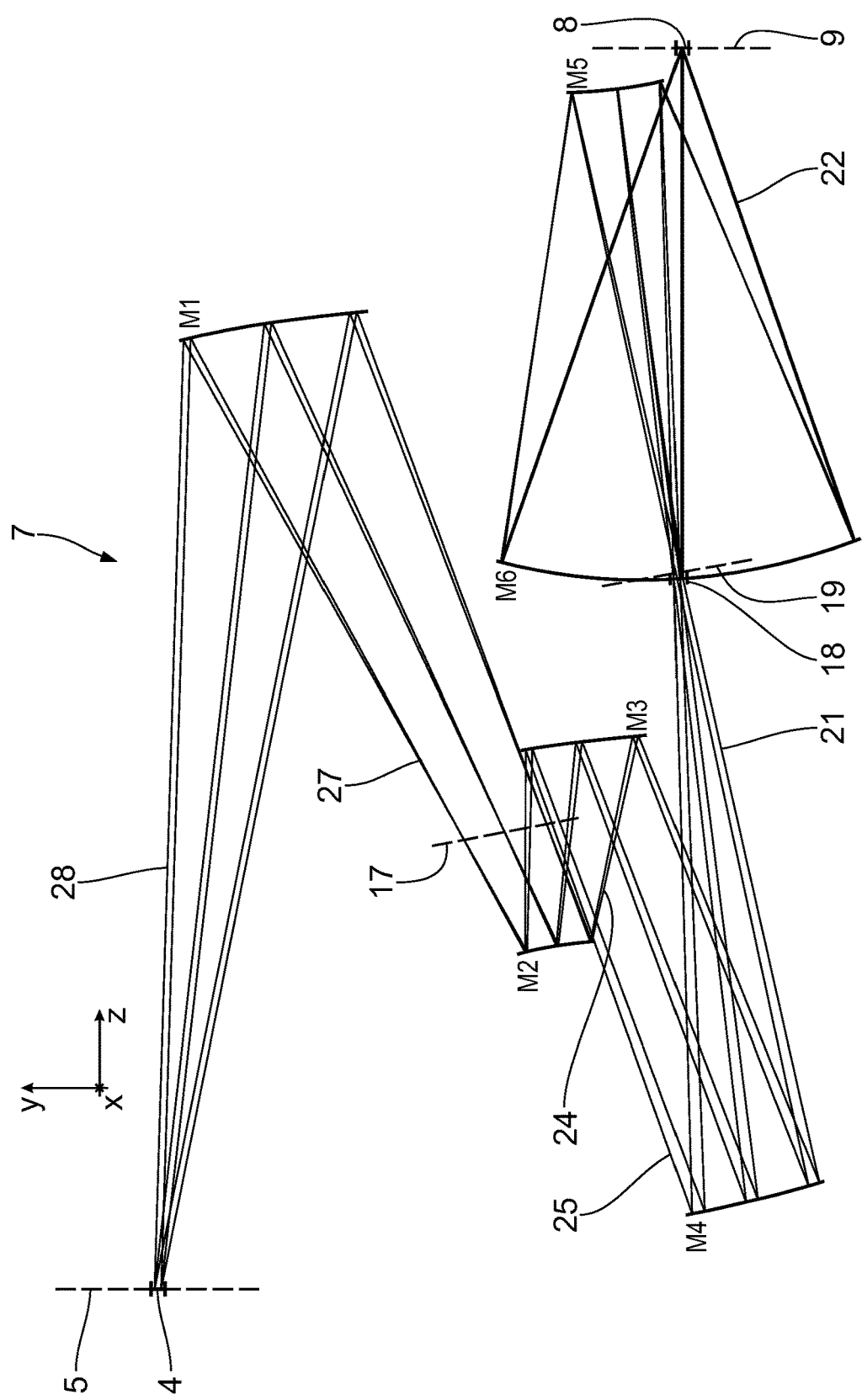

FIG. 21 shows a further embodiment of the projection optical system 7. Components which correspond to those which have already been described above with reference to the projection optical system 7 from FIGS. 2 to 20 have the same reference numerals and will not be discussed again in detail.

The imaging beam path of the projection optical system 7 according to FIG. 21 corresponds to that of the embodiment according to FIG. 18.

No back to back arrangements are present in the embodiments according to FIGS. 18 to 21 in the imaging beam path between the object field 4 and the mirror M4. In particular the mirrors M1 and M4 are not arranged back to back with respect to one another.

To produce a microstructured or nanostructured component, the projection exposure installation 1 is used as follows: firstly, the reflection mask 10 or the reticle and the substrate or the wafer 11 are provided. A structure on the reticle 10 is then projected onto a light-sensitive layer of the wafer 11 with the aid of the projection exposure installation. By developing the light-sensitive layer, a microstructure or nanostructure is then produced on the wafer 11 and therefore the microstructured component.

What is claimed is:

1. An imaging optical system, comprising:
    a plurality of mirrors configured to image an object field in an object plane into an image field in an image plane along a beam path of imaging light,
    wherein:
        the last mirror in the beam path of the imaging light between the object field and the image field has a through-opening to pass the imaging light;
        the penultimate mirror in the beam path of the imaging light between the object field and the image field is outside an imaging light bundle in front of the imaging field; and
        a reflective face of the penultimate mirror within an optically used region of the penultimate mirror has no through-opening to pass the imaging light.

2. The imaging optical system of claim 1, wherein a working spacing of the penultimate mirror in the beam path of the imaging light between the object field and the image field of the imaging light is at least 20 mm.

3. The imaging optical system of claim 1, wherein an angle of incidence of the imaging light on the penultimate mirror is at most 35°.

4. The imaging optical system of claim 1, comprising an imaging beam path section between a third to last mirror in the beam path of the imaging light between the object field and the image field and the penultimate mirror in the beam path of the imaging light between the object field and the image field, wherein a portion of the imaging beam path in front of the imaging beam path section and an imaging light bundle in a region of the image field are guided on opposing sides of the imaging beam path section, respectively.

5. The imaging optical system of claim 1, comprising an imaging beam path section between a third to last mirror in the beam path of the imaging light between the object field and the image field and the penultimate mirror in the beam path of the imaging light between the object field and the image field, wherein a portion of the imaging beam path in front of the imaging beam path section and an imaging light bundle in a region of the image field are guided on the same side of the imaging beam path section.

6. The imaging optical system of claim 1, wherein a third to last mirror in the beam path of the imaging light between the object field and the image field and a sixth to last mirror in the beam path between the object field and the image field are arranged back to back.

7. The imaging optical system of claim 1, comprising an intermediate image in the beam path of the imaging light between the object field and the image field.

8. The imaging optical system of claim 1, comprising an intersection region between imaging beam path sections.

9. The imaging optical system of claim 1, wherein the imaging optical system has a numerical aperture of at least 0.3.

10. The imaging optical system of claim 1, wherein the image field is a rectangular field.

11. The imaging optical system of claim 1, wherein the imaging optical system is a microlithography projection optical system.

12. A projection exposure installation, comprising:
    an illumination system; and
    a projection optical system comprising the imaging optical system of claim 1,
    wherein the projection exposure apparatus is a microlithography projection exposure apparatus.

13. A method, comprising:
    providing a microlithography projection exposure comprising:
        an illumination system; and
        a projection optical system comprising the imaging optical system of claim 1; and
    using the projection exposure installation to project a structure on a reticle onto a light-sensitive layer of the wafer.

14. The imaging optical system of claim 1, wherein only the last mirror in the beam path of the imaging light between the object field and the image field has a reflective surface that surrounds a through-opening to pass the imaging light.

* * * * *

UNITED STATES PATENT AND TRADEMARK OFFICE
CERTIFICATE OF CORRECTION

PATENT NO. : 10,481,500 B2
APPLICATION NO. : 13/197065
DATED : November 19, 2019
INVENTOR(S) : Hans-Juergen Mann et al.

Page 1 of 1

It is certified that error appears in the above-identified patent and that said Letters Patent is hereby corrected as shown below:

Page 2, Column 2 under item (56), (Other Publications), Line 25, delete "2104." and insert --2014.--.

Signed and Sealed this
Seventh Day of April, 2020

Andrei Iancu
*Director of the United States Patent and Trademark Office*